United States Patent [19]

Sawasaki et al.

[11] Patent Number: 5,748,487
[45] Date of Patent: May 5, 1998

[54] SYSTEM AND METHOD FOR GENERATING A HAZARD-FREE ASYNCHRONOUS CIRCUIT

[75] Inventors: Milton Hiroki Sawasaki, Sao Paulo, Brazil; Chantal Ykman-Couvreur, Brusell, Belgium; Bill Lin, Louvain, Belgium; Hugo De Man, Louvain, Belgium

[73] Assignee: IMEC, Louvain, Belgium

[21] Appl. No.: 381,081

[22] Filed: Jan. 31, 1995

[51] Int. Cl.$^6$ .................................................. G06F 17/50
[52] U.S. Cl. ........................................ 364/489; 364/488
[58] Field of Search ................................. 364/488, 489

[56] References Cited

U.S. PATENT DOCUMENTS

| 4,763,289 | 8/1988 | Barzilai et al. | 364/578 |
| 5,282,146 | 1/1994 | Aihara et al. | 364/489 |
| 5,469,367 | 11/1995 | Puri et al. | 364/489 |
| 5,493,505 | 2/1996 | Banerjee et al. | 364/488 |
| 5,550,760 | 8/1996 | Razdan et al. | 364/578 |

OTHER PUBLICATIONS

Beerel, P. and Meng, T., "Automatic Gate–Level Synthesis of Speed–Independent Circuits" IEEE, pp. 581–586, 1992.
Chu, T., "Synthesis of Self–timed VLSI Circuits from Graph—Theoretic Specifications" IEEE, pp. 220–223, 1987.
Kishinevsky, M.A. et al., "On Self-Timed Behavior Verification" ACM Intl. Workshop on Timing Issues in the Specification and Synthesis of Digital Systems, Mar. 1992.
Kondratyev, A. et al., "Signal Graphs: A Model for Designing Concurrent Logic" Proceedings of the International Conference on Parallel Processing, pp. 51–54, Aug. 1988.
Kondratyev, A. et al, "On the Conditions for Gate–Level Speed–Independence of Asynchronous Circuits" ACM Intl. Worikshop on Timing Issues in the Specification and Synthesis of Digital Systems, Sep. 1993.

Lavagno, L. et al., "Synthesis of Hazard–free Asynchronous Circuits with Bounded Wire Delays", pp. 1–36, Nov. 19, 1992.
Lavagno, L. and A. Sangiovanni–Vincentelli, "Linear Programming for Optimum Hazard Elimination in Asynchronous Circuits" IEEE, pp. 275–278, 1992.
IMEC Laboratory, *Assassin: An Asynchronous I/Q Interface Synthesis System*, Nov. 15, 1993.
Moon, C. et al., "Synthesis of Hazard–free Asynchronous Circuits from Graphical Specifications" IEEE, pp. 322–325, 1992.
Murata T., "Petri Nets: Properties, Analysis and Applications", IEEE, pp. 541–580, Apr. 1989.
Norwick, S. and D. Dill, "Exact Two–Level Minimization of Hazard–Free Logic with Multiple–Input Changes", IEEE, pp. 626–630, 1992.
Sentovich, E. et al, "SIS: A System for Sequential Circuit Synthesis" pp. 1–45, May 4, 1992.
Varshavskiy, V. I. et al. "Models for Specification and Analysis of Process in Asynchronous Circuits" Scripta Technica, Inc., pp. 61–76, 1989.

*Primary Examiner*—Vincent N. Trans
*Attorney, Agent, or Firm*—Knobbe, Martens, Olson & Bear, LLP

[57] ABSTRACT

A flip-flop-based circuit architecture generates a hazard-free asynchronous signal given the SET and RESET sum-of-product (SOP) solutions to an asynchronous process. The flip-flop SET and RESET SOP solutions can be hazardous. Thus, general purpose synchronous optimization tools (which are indifferent to hazards) can be used to derive the optimal SOP solutions. A fixed layer built around the SOP cores eliminates all hazards in the circuit. In one embodiment, the architecture is optimized by eliminating an RS latch and delay lines in the SOP cores. The architecture of the present invention is guaranteed to admit any semi-modular race-free state graph representation of an asynchronous process that satisfies the n-shot requirement. The state graph representations can be examined to determine if alternate, solution-specific, simplified architectures can be employed that further decrease the final area by the elimination of flip-flops or the elimination of a timing delay.

13 Claims, 33 Drawing Sheets

TIMING DIAGRAM

SIGNAL TRANSITION GRAPH

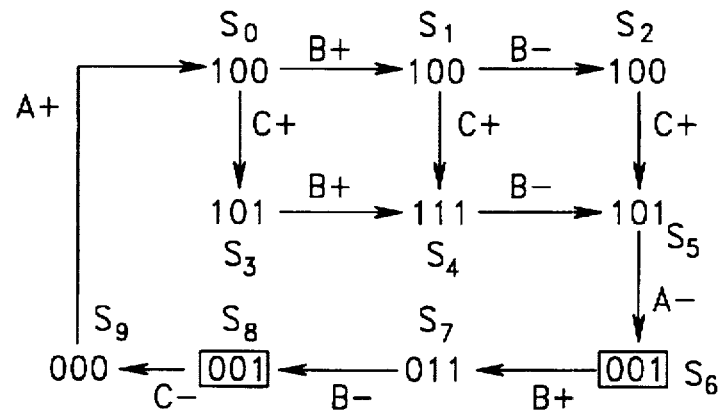
STATE GRAPH
FIG. 1C(1)
(PRIOR ART)
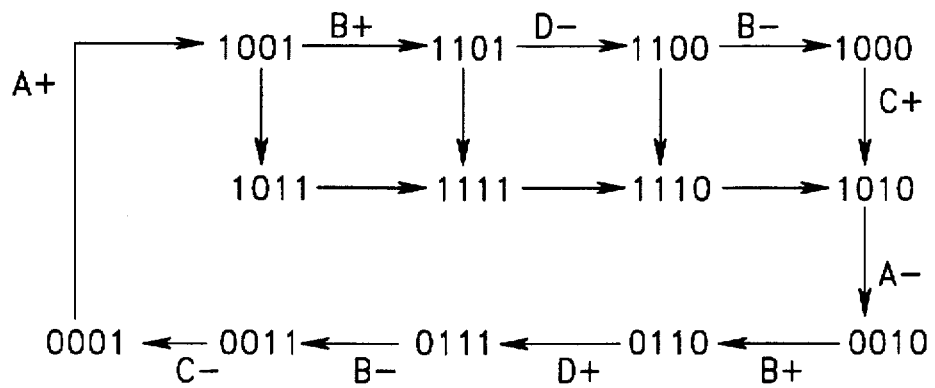
CORRECTED STATE GRAPH
FIG. 1C(2)

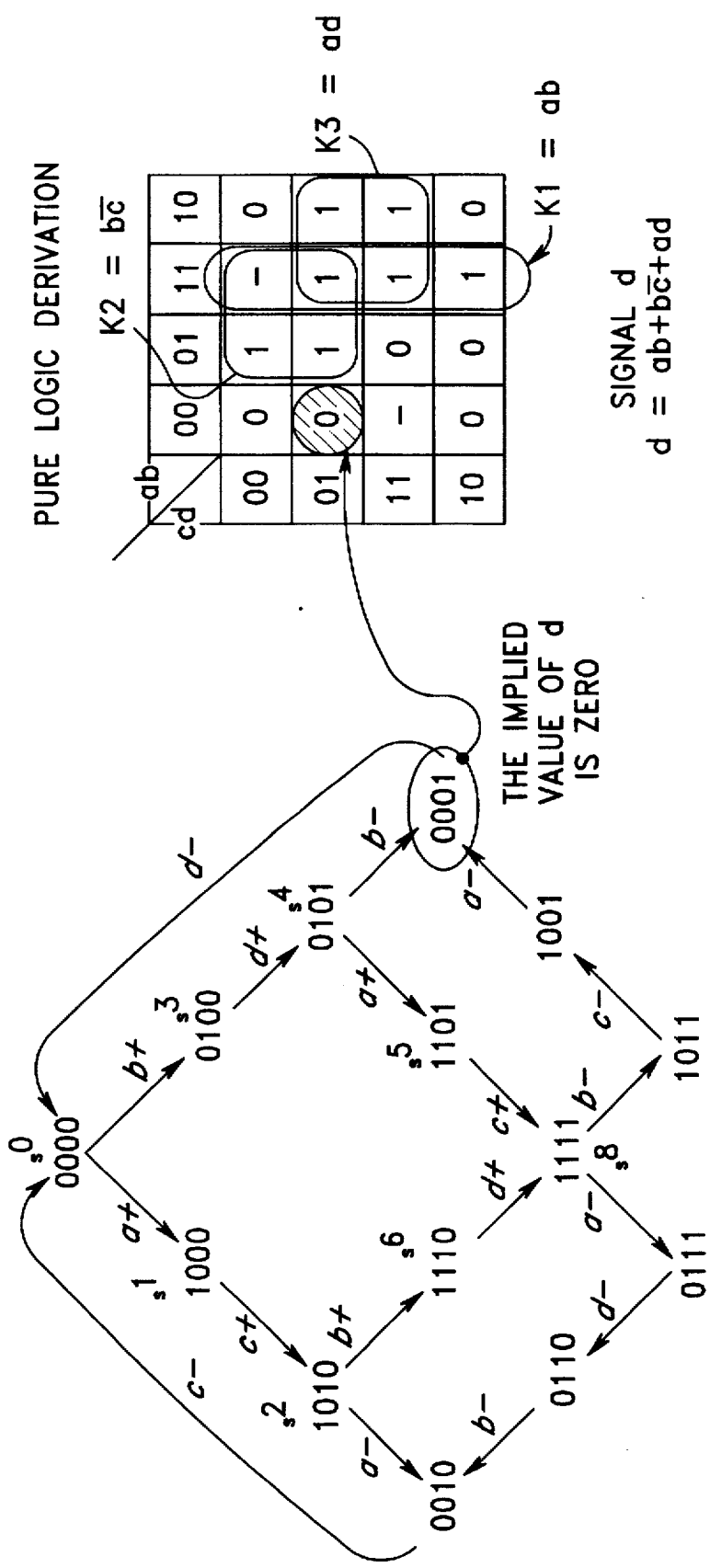

INPUTS: a, b, d
OUTPUTS: c

SIGNAL C

| cd \ ab | 00 | 01 | 11 | 10 |
|---|---|---|---|---|
| 00 | 0 | 1 | – | 1 |
| 01 | 0 | 0 | 0 | 0 |
| 11 | 0 | 1 | 0 | 0 |
| 10 | 0 | 1 | 1 | 1 |

FIG. 10C

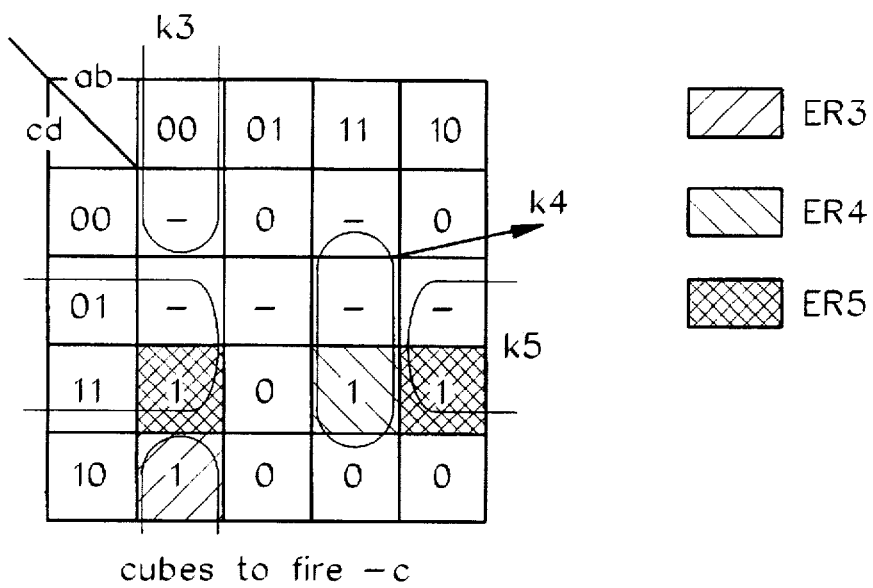
cubes to fire −c
FIG. 10D₁
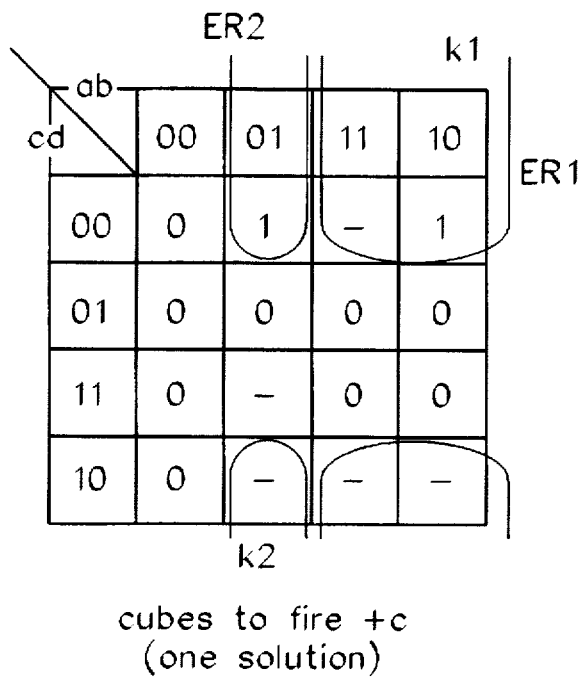
cubes to fire +c
(one solution)
FIG. 10D₂ cubes to fire +c

*FIG. 10F₁* cubes to fire −c

*FIG. 10F₂*

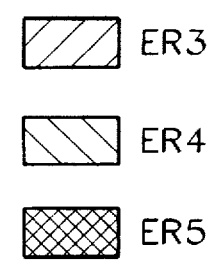
cubes to fire +c
FIG. 10H₁
cubes to fire −c
FIG. 10H₂ cubes to fire +c

FIG. 10J₁ cubes to fire −c

FIG. 10J₂

SYSTEM AND METHOD FOR GENERATING A HAZARD-FREE ASYNCHRONOUS CIRCUIT

BACKGROUND OF THE INVENTION

1. Field of the Invention

The invention relates to the automation of asynchronous circuit designs, and more specifically to the generation and implementation of hazard-free asynchronous circuit designs.

2. Background of the Invention

Races and Hazards in Asynchronous Circuits

Problems specific to the design of asynchronous control circuits are races and hazards. In general, a race-free asynchronous circuit is a circuit that will always respond as specified given enough time. That is, if the inputs of the circuit are frozen, and the outputs are observed after all internal switchings have occurred, then the specified output values are always observed. Race-freeness is a necessary condition for a correct asynchronous circuit.

A hazard-free asynchronous circuit is a circuit in which the specified output values are continuously observed and no unexpected values are intermittently observed. This is, if the inputs of the circuit are frozen, the specified output values are continuously observed. Hazard-freeness is also a necessary condition for a correct asynchronous circuit.

Modeling Asynchronous Circuits

Because time is not used to pace the operation of an asynchronous circuit, the specification and correct implementation of an asynchronous circuit design is quite complex. Events, signal transitions, or alternative indicia are generally used as pacers in models where implicit clocks are not part of the semantics.

Signal transition graphs (STGs) are used as a formal basis for the automatic synthesis of asynchronous designs. State graphs (SGs) represent a general model where low level circuit details become more evident. SGs are a generally accepted low level form of representation with well defined semantics that capture every possible event occurrence. Because of the simplicity behind the SG semantics, SGs provide a strong basis to formalize asynchronous circuit properties and to derive clear links between the SG representation and its implementation (i.e., in a circuit design). As is conventionally known in the art, an STG can be transformed into an SG (see, e.g., T. A. Chu, "Synthesis of self-timed VLSI circuits from graph-theoretic specifications", *Ph. D. thesis*, MIT, June 1987, hereinafter Chu Thesis).

Informally, an SG has the following basic properties:

1) Any two consecutive states always differ by one and only one bit.
2) The time it takes to make a state transition is any finite non-zero time.
3) A state transition represents an input or an output event.
4) An event is simply a (0 to 1) or a (1 to 0) signal change.

SGs are more formally defined in Appendix A.

FIGS. 1a through 1d show a typical asynchronous circuit design path. First, a high-level description of the asynchronous process in the form of a timing diagram is given. In the example of FIG. 1a, a handshaking status generator timing diagram is shown with inputs signals a and c, and output signal b. In FIG. 1b, an STG is generated from the timing diagram in FIG. 1a. In FIG. 1c(1), an SG is conventionally generated from the STG in FIG. 1b (or directly from the timing diagram in 1a). Each state transition of the SG captures one possible event occurrence. The SG can be mechanically generated from the STG. In the example of FIG. 1c(1), a code conflict occurs at state 001 (explained below) and is resolved by adding a signal as shown in FIG. 1c(2). A hazard-free circuit can then be derived from the SG as shown in FIG. 1d.

Implementation of Models

To implement an SG (e.g., in a circuit), the states of an SG are interpreted as the states of the domain of a Boolean function that implements an output signal. The output signal can be implemented using pure logic or latches.

Logic can be derived for each output signal in an SG by considering at each state the next state value of the output signal, which is called the implied value. For example, an SG for an asynchronous process with input signals a and b, and output signals c and d is shown in FIG. 2a. At state s__3, the implied value of d is ONE. At state s__9, the implied value of d is ZERO. FIG. 2b is a Karnaugh map with the implied values for signal d. "DON'T CARES" are assigned to the unreachable states (i.e., 1100, 0011)—these are states that are not specified in the SG. Thus, from the Karnaugh map, signal d can be represented logically as d=ab+b(_c)+ad. The logic representation can be conventionally implemented in a logic circuit.

Another way to implement signal d is to use an asynchronous flip-flop or so-called C-element. The flip-flop has a SET input, a RESET input, and an output, OUT. The flip-flop implements the output signal. As a flip-flop is a memory, it suffices to only generate the logic to either set or reset it. The output signal is implemented with two auxiliary Boolean functions where one is used to set the flip-flop to generate d+ (SET) and the other is used to reset the flip-flop to produce d− (RESET). These auxiliary Boolean functions are called SET and RESET functions or solutions. The implementation of the output signal corresponds to the implementation of the SET and RESET functions. The Boolean functions SET and RESET are generally expressed in sum-of-product (SOP) format.

FIG. 2c is an example Karnaugh map of a flip-flop-based solution to the SG in FIG. 2a. For the SET Boolean function, it suffices to consider the implied value for output signal d as ONE only at states s__3 and s__6. It is only at these states that d+ must be fired. At all other states where the implied value of d is ONE, a DON'T CARE is assigned. This assignment corresponds to the fact that after d+ is produced, the flip-flop will keep d at ONE in place of the logic. A ZERO is assigned to all states where the implied value of d is ZERO and DON'T CARES to all unreachable states. The RESET Boolean function is similarly derived to fire d−. The SET and RESET functions are then implemented in logic to drive the asynchronous flip-flop to implement the signal d as figuratively shown in FIG. 2c.

For the flip-flop-based solution, a number of states that were assigned a ONE in the pure logic derivation are now assigned DON'T CARES. A flip-flop has the effect of producing additional DON'T CARE states other than the unreachable states. In a pure logic derivation, DON'T CARE states correspond to the unreachable states (or non-specified states) in an SG. In a flip-flop-based derivation, DON'T CARE states correspond to the unreachable state set plus all states where a signal is stable. Thus, flip-flop-based solutions are preferred because of the availability of a larger DON'T CARE set.

Unfortunately, simply deriving the logic or flip-flop-based solutions from SGs as described does not guarantee that the derived circuit is correct. Races and hazards must be eliminated.

Prior Art Failures

One approach is to use complex gates to implement a hazard-free solution. However, the use of complex gates gives rise to new practical problems. As a complex gate is primarily a parallel-serial transistor network, as the complexity of the network grows, so does the number of serial N or P transistors. This significantly slows down in the response of the complex gate. In practice, only integration of simple two-level logic e.g., AND-NORs or OR-NANDs, are available in complex gates. Even if more complex gates are available, an enormous number of complex gate instances are required to cover any possible configuration. In general, a custom design is required for every race-free SG specified.

An improved solution is to substitute derived complex gates with a logic network composed of basic gates (e.g., NANDs, NORs, ANDs, ORs, negation). An architecture is fixed based on an asynchronous C-element flip-flop, and a simplified logic network is constructed from the complex solution to drive the flip-flop. However, a hazard-free network is only guaranteed for the limited class of race-free distributive SGs (distributivity, as defined below, informally means a restriction in the way concurrency can be represented). Even within this class of SGs, a solution is not guaranteed to be found without transforming the SG into a new SG by adding signals.

Another approach is to impose a so-called Monotonous Cover (MC) requirement on the SG. In general, MC ensures that one and only one gate switches at a time in order to fire an output signal. In this case no hazards can be produced because there is no second gate being turned ON—the hazardous mechanism is never triggered. However, under the MC requirement, the given architecture can only solve a the limited class of distributive semi-modular SGs.

In another solution, hazards are accounted for during the transient response by correcting the delay response of each cell such that hazards are avoided. This approach is based on the assumption that given a library of cells, each cell has a delay variation range associated with it that is well characterized and guaranteed by the foundry specifications. Transient responses can be corrected by adding delay lines in specific points in order to eliminate hazards. However, this delay insertion method relies on the fact that the delay requirements are one sided inequalities. That is, the problem can be solved when one path needs to be slower than the other to eliminate hazards. However, if double sided inequalities exist, i.e., one path has to be both slower than a first path and faster than a second path, the problem can not be solved.

The so-called Burst Mode Finite State Machines (FSMs), uses the principle that at certain specified states, the environment is stable long enough such that every gate stabilizes. The fact that the environment is stable long enough at some states eliminates some of the potential hazards. Then, necessary and sufficient conditions to eliminate remaining hazards are constructed. However, the environmental conditions correspond to implicit timing constraints added to the environment. These assumed timing constraints can only be checked to be valid after a circuit is generated to verify whether the actual timing of the environment does guarantee internal circuit stabilization at all states where it was assumed to eliminate hazards.

In summary, the prior art approaches attempt to eliminate hazards by manipulating and restricting the logic solution in order to account for asynchronous properties represented in the SG (or STG, CD, or other formal model). Under the imposed restrictions a solution may not exist. The restrictions are generally expressed as graph properties that must be present in the SG in order to derive a hazard-free implementation (e.g., MC requirement). If the SG does not conform to the restrictions imposed to it, then it must be transformed into a new one. This process continues until the final SG satisfies the restrictions. Convergence of such a loop is not guaranteed. Also, the transformations may not lead to an optimal solution, but rather to larger and slower circuits, or to no solution at all. The various methods differ in the degree of the restrictions that are imposed on the SG and on how the architecture is considered. The prior art methods for eliminating hazards in the implementation of asynchronous circuits have not reached a solution in a feasible or practical manner.

It would be desirable to define an architecture (e.g., a flip-flop) that implements an optimal hazard-free circuit without imposing significant restrictions on the SG representation or using complex logic implementations. In addition, it would be advantageous to use existing synchronous logic circuit minimization, optimization, mapping, routing, and synthesis tools to derive the asynchronous logic functions (e.g., SET and RESET) of the architecture, i.e., use synchronous logic CAD tools to derive asynchronous circuits.

SUMMARY OF THE INVENTION

A flip-flop-based circuit architecture generates a hazard-free asynchronous signal given the SET and RESET sum-of-product (SOP) solutions to an asynchronous process. The flip-flop SET and RESET SOP solutions can be hazardous. Thus, general purpose synchronous optimization tools (which are indifferent to hazards) can be used to derive the optimal SOP solutions. A fixed layer built around the SOP cores eliminates all hazards in the circuit. The architecture, called n-shot, admits any asynchronous process that can be defined in a semi-modular race-free state graph representation. A variant architecture called n-shot+ is also disclosed.

In general, the n-shot architecture transforms the SG requirements into one global timing requirement that is satisfied in the architecture. The global timing requirement is independent of the SG and can always be satisfied (e.g., by delay compensation). The global timing check is compensated for out of the critical path of the circuit. Any remaining SG requirement is eliminated by boosting the functionality of the asynchronous flip-flop.

Conventional SOP solutions are derived for the asynchronous process at hand. A delay line signal from the output of the flip-flop is added as a literal to each product, and as a product to the sum. Thus, an SOP function $f_{set}=s_1+s_2+\ldots+s_n$ used to +fire an output signal p is modified as $f_{set-new}=s_1\cdot\neg p+s_2\cdot\neg p+\ldots+s_n\cdot\neg p+p$. The RESET-SOP core is similarly modified as $f_{reset-new}=s_1\cdot p+s_2\cdot p+\ldots+s_n\cdot p+\neg p$.

The n-shot flip-flop comprises three RS latch modules. The first RS latch module comprises an RS latch coupled to two AND gates, and functions to select the mode of operation: set-mode, reset-mode, or quiescent mode. The second RS latch module comprises an RS latch and a filter, and functions as a mutual exclusion element that provides the functional behavior of the flip-flop (i.e., an inertial barrier and pure gate delays). The third RS latch module produces the asynchronous hazard-free output events OUT and ¬OUT.

Delay lines, SDline and RDline, with delays $td_{SD}$ and $td_{RD}$, respectively, are used to force gate stabilization in order to avoid misfirings. Delays $td_{SD}$ and $td_{RD}$ are calculated from delay information on the components used to construct the n-shot architecture. The delay requirements are always satisfiable and are generally negligible or no delay compensation is required. When delay compensation is required, the delay lines are not in the critical path and generally do not affect the speed of the circuit.

In operation, a pulse stream is used instead of a single pulse. Each pulse stream is converted into one single firing transition at the output of the flip-flop. The flip-flop operates in three modes: set-mode (the flip-flop can be +fired and cannot be −fired), reset-mode (the flip-flop cannot be +fired and can be −fired), and quiescent-mode (the flip-flop can be neither +fired nor −fired). The flip-flop protocol enforces a cyclical operation of: set-mode, quiescent-mode, reset-mode, quiescent-mode, and then repeats.

The n-shot+ architecture optimizes the n-shot architecture by eliminating the SOP core delay lines and the RS latch in the first latch module of the n-shot flip-flop. The n-shot+ architecture comprises SET- and RESET-SOP solutions, a flip-flop, and a delay line. In one embodiment, the components of the n-shot+ flip-flop are implemented in transistor-based logic circuits.

Using to the present invention (n-shot or n-shot+), the synthesis procedure for hazard-freeness can be partitioned into two independent phases: a synchronous phase, and an asynchronous phase. In the synchronous phase, synchronous-oriented optimizations can be used to derive optimal SOP logic functions as if designing a synchronous circuit. No provisions or constraints need be made for hazards. The solution can be optimized for area, speed, and power by directly using available synchronous logic synthesis techniques and tools. The n-shot (or n-shot+) architecture guarantees the solution has a hazard-free implementation, even if the SOP solutions are hazardous.

In the asynchronous phase, an analysis of the state graph representation is performed to determine if alternate, solution-specific, simplified architectures can be employed that further decrease the final area by the elimination of flip-flops or the elimination of a timing delay.

BRIEF DESCRIPTION OF THE DRAWINGS

FIGS 1a through 1d illustrate a typical design path for asynchronous circuits of conventional design (prior art).

FIG. 1a is an example asynchronous timing diagram.

FIG. 1b is an example signal transition graph (STG) of the timing diagram in FIG. 1a.

FIG. 1c(1) is an example state graph (SG) of the timing diagram in FIG. 1a and the STG in FIG. 1b.

FIG. 1c(2) is a race-free implementation of the state graph FIG. 1c(1).

FIG. 1d an example logic circuit diagram of the SG in FIG. 1c(1).

FIG. 2a is an example of a conventional state graph (SG).

FIG. 2b is an example of a conventional Karnaugh map of a logic-based solution to the SG in FIG. 2a.

FIG. 2c is an example of a conventional Karnaugh map of a flip-flop-based solution to the SG in FIG. 2a.

FIG. 3b is an example of a conventional Karnaugh map of a flip-flop-based solution to the SG in FIG. 3a.

FIG. 3c is an example of a conventional circuit diagram for the Karnaugh map in FIG. 3b.

FIG. 5b is a logic circuit diagram of the n-shot architecture of FIG. 5a.

FIG. 6b is a logic circuit diagram of the n-shot+ architecture of FIG. 6a.

FIG. 8b illustrates the asynchronous optimization step of the asynchronous synthesis design method of FIG. 8a.

FIG. 10a–10l illustrate the present invention by an example.

FIG. 10a illustrates an example asynchronous process.

FIG. 10b is an example semi-modular state graph with input choices that shows the excitation regions of signal c for the process in FIG. 10a.

FIG. 10c is an example Karnaugh map of the ON-set function of signal c under the hard cover (HC) requirement.

FIG. 10d-1 and FIG. 10d-2 are example Karnaugh maps of the ON- and OFF-set functions, respectively, of signal c under the monotonous cover (MC) requirement.

FIG. 10e illustrates the MC cover restriction on the state graph shown in FIG. 10b.

FIG. 10f-1 and FIG. 10f-2 are example Karnaugh maps of the ON- and OFF-set functions, respectively, of signal c under the one-shot requirement.

FIG. 10g is an example logic circuit diagram of the one-shot architecture implementation of signal c.

FIG. 10h-1 and FIG. 10h-2 are example Karnaugh maps of the ON- and OFF-set functions, respectively, of signal c under the auto_C requirement.

FIG. 10i is an example logic circuit diagram of the auto_C architecture implementation of signal c.

FIG. 10j-1 and FIG. 10j-2 are example Karnaugh maps of the ON- and OFF-set functions, respectively, of signal c under the n-shot requirement.

FIG. 10k is an example logic circuit diagram of the n-shot architecture implementation of signal c.

DESCRIPTION OF THE PREFERRED EMBODIMENTS

Before describing the n-shot and n-shot+ architectures, and the asynchronous design method of the present invention, some introduction to state graphs and asynchronous circuit design is presented below. See also Background of the Invention above and Appendices A–C.

I. INTRODUCTION

A. State Graphs and Semi Modularity

State graph (SG) representations are generally used as an initial design specification of asynchronous circuits because they have well defined atomic semantics and general SG properties can be proved. Given the SG semantics, different types of graph lattices can be constructed that give rise to different SG classes. One such class that is used as a primary representation for low level synthesis of asynchronous circuits is the semi-modular class with input choices (see, e.g., Chu Thesis cited above). A semi-modular state graph with input choices records all possible event occurrences (concurrency and input choices) where each event is represented as a state transition.

Figure 1A:
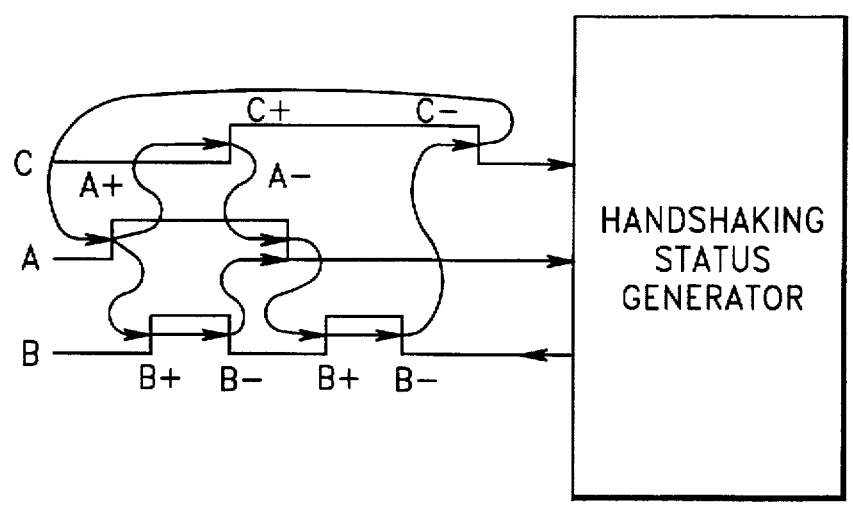

Semi-modularity captures event concurrency by representing all possible event occurrence sequences. For example, in FIG. 1a, the events c+ and {b+, b–} are concurrent, i.e., there is no precedence relation between them. In the SG of FIG. 1c(1), their concurrency is a synonym of having the following sequences represented: <c+, b+, b–> or <b+, c+, b–> or <b+, b–, c+>. These sequences are captured as the different traversals of the states: {s_0, s_1, s_2, s_3, s_4, s_5} in the SG of FIG. 1c(1).

Branchings and input choices are also captured at the SG level. Branching occurs when either the environment or the circuit itself determines which path should be followed in the SG. For example, in FIG. 2a, the SG corresponds to an interface that executes one out of six protocols with input signals a and b and output signals c and d. Each protocol corresponds to a 4-phase handshaking or a variant and their execution depends on the input event sequences on signals a or b. At states s_0, s_2, s_4, s_8, the environment determines which paths should be followed. Thus, the execution of the protocols: <a+, c+, a–, c–> or <b+, d+, a+, c+, a–, d–, b–, c–> is determined by the environment. When state branchings are always determined by the environment, they are called input choices. When they are determined by the circuit itself, a mutual exclusion occurs.

B. Regions, Cubes, and Covers

A semi-modular state graph can be divided into regions that capture the next state behavior of a given signal. Generally, a region is a collection of connected states where a given signal is, for example, expected to transition or it is stable. An excitation region of a signal, p, denoted as ER(*p), is a maximal connected set of states in which p has the same value and is excited. The excitation region corresponding to a specific transition *p is denoted as ER(*p_i). If p is a non-input signal, once an excitation region ER(*p) is entered, it can only be exited by the firing of *p. A quiescent region of a signal p is the maximal connected set of states directly reachable from ER (*p_i) by the firing of *p_i in which p has the same value and is not excited. A quiescent region is denoted as QR(*p_i).

Regions are functionally linked to associated logic circuits that implement the region. A "cube cover" over a region defines more formally the link between a region in the SG and its implementation as a SET or RESET function in SOP form. Formally, a literal k is a variable or its complement. A cube c is a set of literals $$l(k \in c) \iff (\bar{k} \notin c).$$

A cube $c = k_1, \ldots k_j (j \leq n)$ "covers" a state $s \in \{0,1\}^n$ if for each $k_i \in c$ that corresponds to some variable p:

$k_i = p$ if p=1 or 1* in s, else $k_i = \bar{p}$ if p=0 or 0* in s.

Figure 2C:
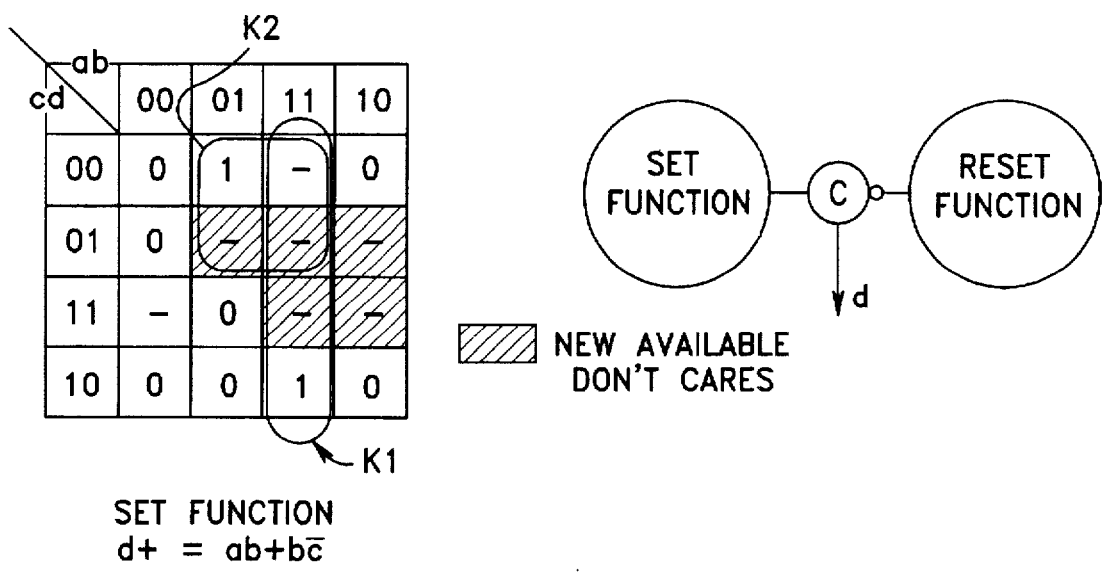

For example, in FIG. 2b, the signal d, has cube covers ab, b(¬c), and ad, which can be implemented as logic in a logic circuit.

State graphs, regions, cubes, and cube covers are defined more formally in Appendix A.

C. Races

A race is a mal-function in the steady state logic response. In an SG, for any traversal of the SG, after stopping at any state and waiting a sufficient time for all the logic to stabilize, the logic must always stabilize at the specified next state value in order for the SG to be a race-free SG.

Figure 3A:
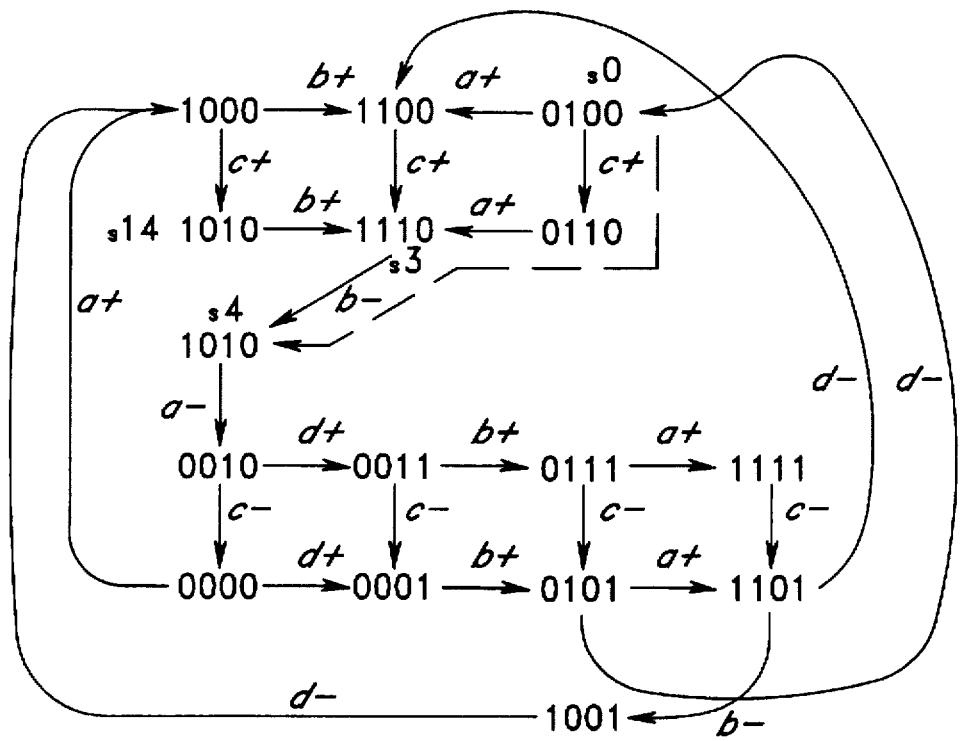
FIG. 3a is an example of a conventional state graph (SG).
Figures 3B, 3C:
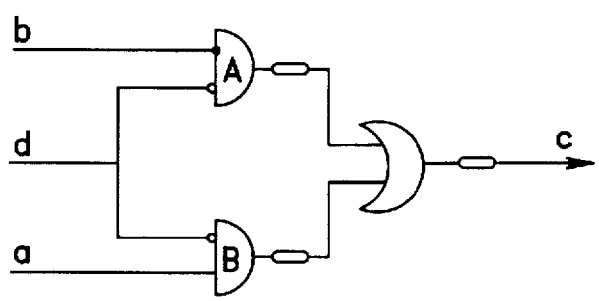

For example, FIG. 3a shows an SG for an asynchronous process with inputs a, b, d and output signal c. FIG. 3b shows the corresponding flip-flop-based Karnaugh map for signal c, which has cube covers b(¬d) (marked cover A) and (¬d)a (marked cover B). Cube covers A and B are logically implemented as gate A and Gate B, respectively, in the SOP flip-flop solution shown in FIG. 3c. The SOP solution is race-free because in the traversal from s_0 to s_4, after stopping at s_4 and waiting enough time for all the logic to stabilize, the output c at its next state value is observed (i.e., ONE).

At the SG level, races can be captured as a state assignment problem. A necessary and sufficient condition for race-freeness, is the so-called complete state coding (CSC) requirement (see, e.g., Appendix A and Chu Thesis). In summary, CSC states that if any two states are assigned the same binary code then the next state values of any output signal must be the same. If this condition is respected, the derived logic is guaranteed to be race-free.

For example, in FIG. 1c(1), the state graph is not race-free because for state s_6=001, the next state value for the output signal b is ONE, and for s_8=001, the next state value for b is ZERO. Thus, there is a violation of the CSC requirement. By adding a signal, d, the SG can be made race free as shown in FIG. 1c(2).

In FIG. 3a, the SG is race-free. Although the states s_4 and s_14 have the same binary codes (1010) and the next state values are different (1110 and 0010, respectively), CSC is satisfied because the difference in state values are due to input signals, not output signals. Thus, the SG in FIG. 3a is race-free.

Obtaining a race-free implementation is equivalent to satisfying the CSC requirement. Races can be eliminated at the SG level by either adding new state signals or by decreasing concurrency to ensure that CSC is satisfied.

D. Hazards

Hazards are mal-functions in the transient logic response. A hazard-free circuit is a circuit that never produces a pulse that is not specified. In an SG, IF after stopping at any state in any traversal of the SG, no pulses are produced during the stabilization of the logic, THEN the SG is hazard-free.

In FIG. 3c, although the SOP solution is race-free (see above), it is not hazard-free, because in traversing the SG from s_0 to s_4, at state s_4, gate A may switch OFF before gate B switches ON, such that a negative pulse is produced at the output c during the stabilization of the logic. The present invention is concerned with the elimination of hazards in asynchronous implementations given a race-free semi-modular SG (e.g., an SG that satisfies CSC).

E. Delay Model

Figure 4:
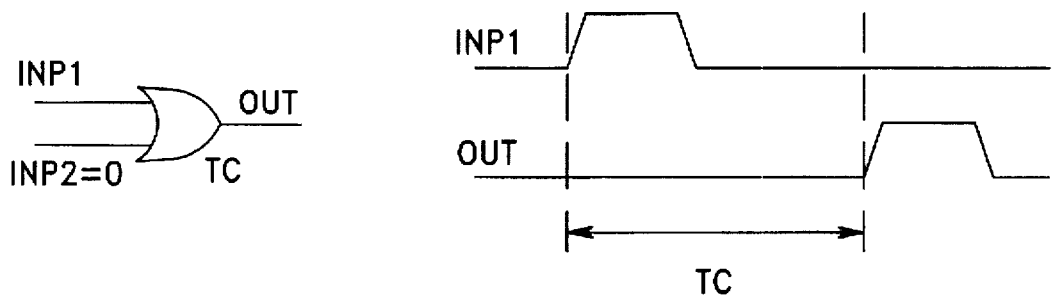
FIG. 4 illustrates a conventional pure delay timing model of a gate.

A hazard is a mal-function that appears during a transient response due to switching delays. Therefore, delays are an essential element in the characterization of hazards. A delay model that indicates how signals propagate through gates and wires is used to characterize the hazards. The present invention uses the so-called pure delay model. Under this model a gate simply translates a signal forward in time by some delay, t__c, associated with the gate. FIG. 4 illustrates a pure delay timing model of an OR gate with input inp1 and inp2 (held at 0), and output out. When signal inp1 changes from 0 to 1, the response in signal OUT is delayed by time t__c.

The pure delay model incorporates some effects that may not represent reality accurately. For example, a very slow gate may in practice not transmit an input spike; if a gate translates a pulse forward in time long after the input excitation has disappeared, a memory effect is produced; or, a gate can remember the shape of an input excitation and reproduce it some time in the future (pure translation).

However, the pure delay model captures the worst case scenario for the propagation of a hazard through a logic network. The pure delay model provides both safeness and simplicity. The pure delay model is discussed more formally in Appendix A.

F. Speed Independence

Speed independence is an assumption that the gate delays are unbounded. Thus, a speed independent solution provides robustness against delay variations. A speed independent solution is independent of any particular library that is chosen for implementation. As such, the delays of each component do not need to be known in advance.

However, in practice the final circuit design is mapped into a specific library where the known delay of each element can be used as additional information to eliminate hazards. Thus, in the present invention speed independence is relaxed as a design constraint in order to eliminate hazards, i.e., speed independence is not an assumption (or considered a requirement) of the hazard-free solution. This is a reasonable compromise if the delay information can bring the area cost down and more complex graphs in a general class of graphs can be solved.

G. The Problem

A circuit that has a wrong long-term response (races) is always wrong regardless of whether the circuit has no transient response glitches (hazards). However, according to the present invention, a circuit that has a correct long-term response (race-free), can be made into a circuit that also has correct transient responses (hazard-free). Thus, the race-free solution space is equivalent to the maximal hazard-free solution space.

It would be ideal to find a hazard-free solution that entirely covers the race-free space. Thus, once a race-free solution is found, a hazard-free solution is guaranteed to exist. Two general strategies are possible. First, given an SG, a logic network can be constructed to eliminate all hazards. This is called the network approach. Second, a given architecture can be defined and fixed. Then, the class of SGs that can be mapped into the architecture such that hazards are guaranteed to be eliminated is defined. The present invention employs the second approach. The n-shot (and n-shot+) architecture is defined and fixed, and the class of SGs that can be mapped to the architecture are all semi-modular SGs that satisfy CSC (i.e., race-free SGs).

II. N-SHOT ARCHITECTURE

Conventional approaches to eliminating hazards attempt to produce an entirely hazard-free logic implementation. However, such a goal is not necessary. Rather, it may be useful to have no hazards present in the signals that communicate with the environment, i.e., internal hazards can exist as long as they are not propagated. The present invention includes sum-of-products (SOP), latch-based architecture, called n-shot, that always admits an optimal hazard-free solution given a race-free SG solution. Unlike the conventional approaches, the SOP core itself can be hazardous. A fixed layer built around the SOP core automatically eliminates all hazards.

Figure 5A:
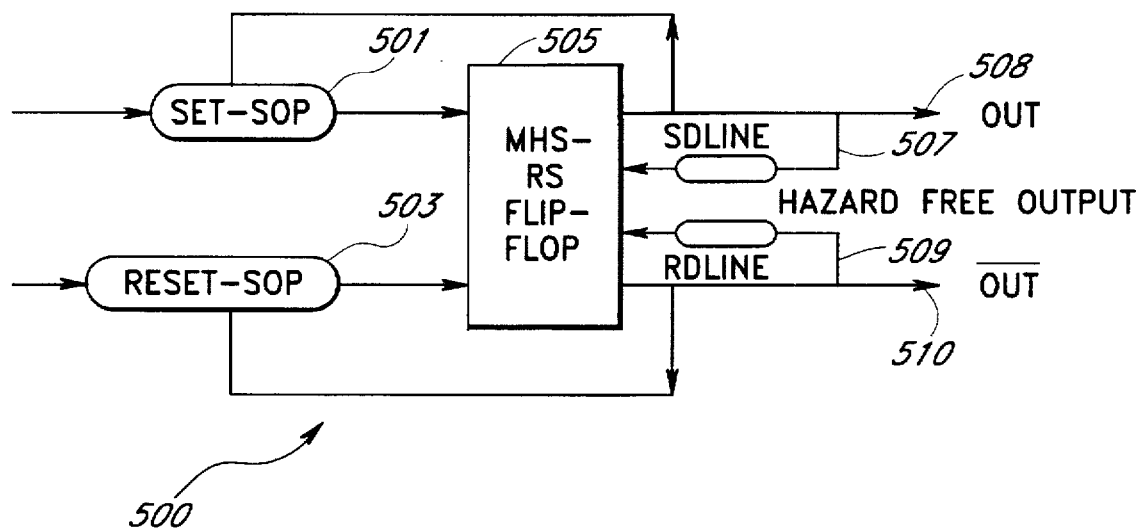
FIG. 5a is a high-level block diagram of the n-shot architecture in accordance with one embodiment of the present invention.

FIG. 5a shows a high-level block diagram of the n-shot architecture 500 according to one embodiment of the present invention. The n-shot architecture is divided into three major parts: two SOP cores, SET 501 and RESET 503, that can have hazards; two delay lines, SDline 507 and RDline 509, for SOP stabilization; and, a cascaded modified master-slave reset-set (MHS-RS) flip-flop layer 505. Flip-flop 505 produces output OUT 508 and ¬OUT 510.

A. MHS-RS Flip-flop

Figure 5B:
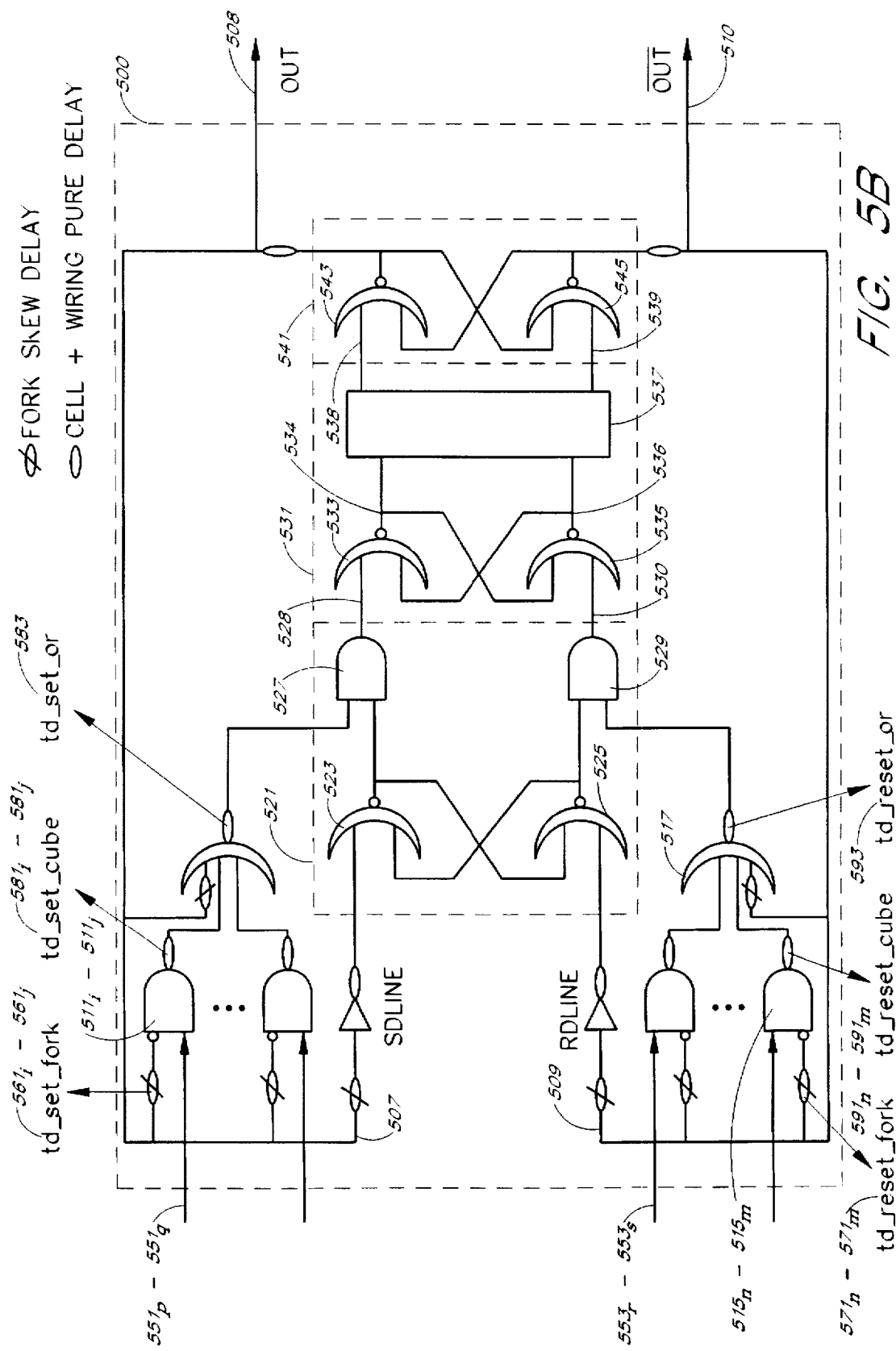

FIG. 5b is a logic circuit diagram of the n-shot architecture according to one embodiment of the present invention. Each particular implementation will vary according to the SOP solutions of the particular problem at hand. In FIG. 5b, the SET-SOP solution comprises a series of AND gates 511i–511j ("products") and an OR gate 513 ("sum"). Similarly, the RESET-SOP solution comprises a series of AND gates 515n–515m and an OR gate 517. Signal inputs to the SET-SOP 551p–551q and RESET -SOP 553r–553s are variously entered in the SET 511i–511j and RESET 515n–515m SOP AND gates, respectively, according to the derived SOP logic solution.

The negation of outputs 508 and 510 are input (with input fork skew delay) to the SET- and RESET-SOP solution AND gates 511i–511j and 515n–515m, respectively, i.e., as literals to each product that comprises the SET- or RESET-SOP solution. Outputs 508 and 510 are also added (with fork skew delay) in the sum of the SET- and RESET-SOP solution OR gates 513,517, respectively, as an additional product. For example, a SET-SOP solution, in the form of: $f_{set}=s_1+s_2+ \ldots +s_n$ used to +fire an output signal p is modified as follows:

1. For each cube $s_i$, add the literal ¬p if $s_i$ does not contain it;

2. Add the cube p to $f_{set}$ if $f_{set}$ does not contain it.

Thus, $f_{set-new}=s_1\cdot¬p+s_2\cdot¬p+ \ldots +s_n\cdot¬p+p$ which corresponds to a SET-SOP core 501 in the n-shot architecture. Similarly, the RESET-SOP core 503 is $f_{reset-new}=s_1\cdot p+s_2\cdot p+ \ldots +s_n\cdot p+¬p$. The SET-SOP solution 511i–511j, 513 (RESET-SOP solution 515n–515m, 517) and additional delay lines 508 (510) comprise the SET-SOP (RESET-SOP) core 501 (503).

MHS-RS flip-flop 505 comprises three RS latch modules 521,531,541. RS latches are simple cross-coupled NOR gates, i.e., the output of each of two NOR gates is connected to one input of the other NOR gate. The three latch modules 521,531,541 are assembled atomically, i.e., no hazards are induced by the wiring delay to connect them or by their internal delays.

The first RS latch module 521 (called the SEL-RS latch module) functions to select the mode of operation: set-mode, reset-mode, or quiescent mode. In addition to the cross-coupled input, NOR gates 523,525 have as input SDline and RDline delay signals 507,509, respectively. Fork skew delays are introduced to synchronize the SDline and RDline signals at input of NOR gates 523,525, respectively. The fork skew delays are the delays existing on the different branches of a fork. In general, internal forks are not isochronic. SDline and RDline 507,509 also pass through a no-op function to introduce cell and wiring pure delay. NOR gates 523,525 output signals to AND gates 527,529, respectively (called SEL-SET and SEL-RESET AND gates). AND gates 527,529 also have as input, the output from SET-SOP and RESET -SOP cores 501,503, respectively (i.e., output from OR gates 513,517, respectively).

Figure 5C:
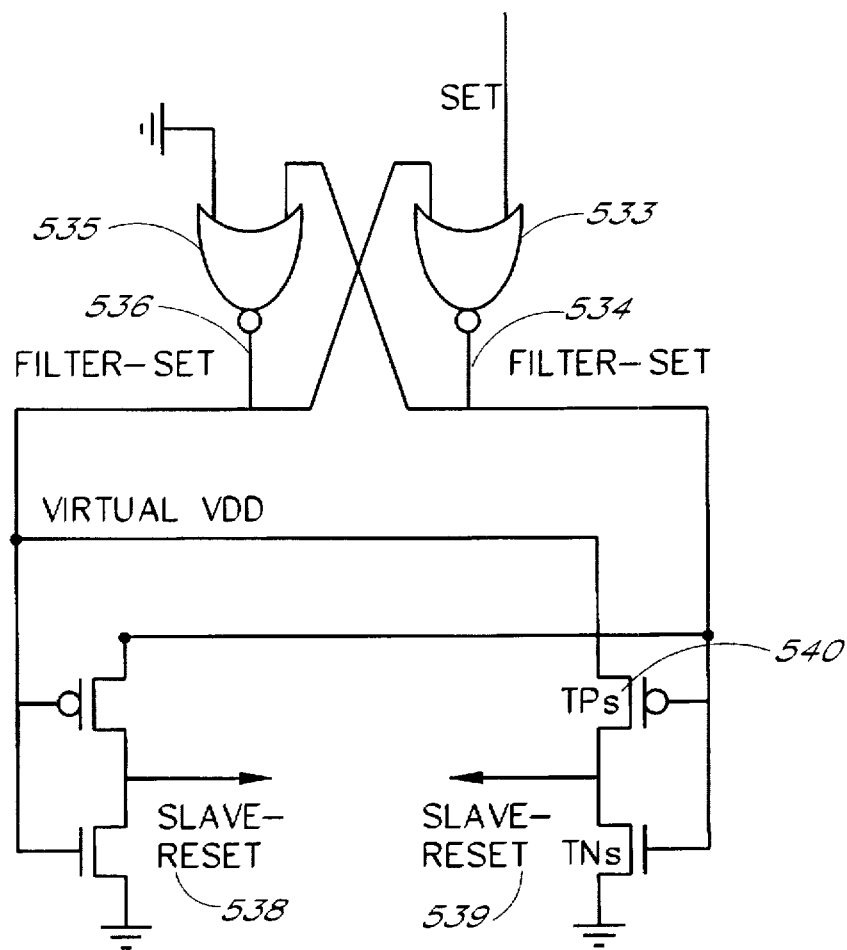
FIG. 5c is one embodiment of a transistor implementation of the n-shot filter according to one embodiment of the present invention.

The second RS latch module 531 (called the ME-RS latch module) is a mutual exclusion (ME) element that acts as a filter. RS latch module 531 provides the functional behavior of the MHS-RS flip-flop, i.e., an inertial barrier and pure gate delays. RS latch module 531 is an RS latch 533,535 coupled to a filter 537. In addition to the cross-coupled input, NOR gates 533,535 have as input the output of SEL-SET and SEL-RESET AND gates 527,529, respectively. The output of NOR gates 533,535 is coupled to filter 537. Filter 537 comprises two degenerated inverters and can be implemented, for example, using transistors as shown in FIG. 5c.

The third RS latch module 541 (called the OUT-RS latch) produces output events 508,510, OUT and ¬OUT, respectively. RS latch module 541 comprises a single RS latch. In addition to the cross-coupled input, NOR gates 543,545 have as input the output of filter 537, i.e., slave-set 539 and slave-reset 538 signals.

The setting and resetting of the MHS-RS flip-flop in FIG. 5b is symmetric. In the following description, $V_{meta}$ is a metastable analog voltage, generally 2.5 volts, $V_{filter\_set}$ is the voltage at the output of NOR gate 535, $V_{filter\_reset}$ is the voltage at the output of NOR gate 533, $V_{TP}$ is the threshold voltage to turn a P transistor ON in filter 537; and $\omega$ is a parameter of ME-RS latch 533,535 which corresponds to the minimum input pulse width that causes ME-latch 533,535 to change states. In one embodiment, $\omega$ is about twice the delay of a NOR gate.

The MHS-RS flip-flop is set by causing slave__set 539 to make a monotonic 1→0 transition. As long as slave__set 539 is at ZERO, slave__reset 538 can fluctuate. However, the fluctuation has no effect on signal OUT 508 because OUT-RS latch 541 cross-coupled input holds OUT at ZERO. Similarly, in FIG. 5c, transistor TPs 540 is the only transistor that can cause slave__set 539 to rise. Transistor TPs 540 is initially OFF and filter__set 536 serves as virtual VDD, where virtual VDD is the difference $V_{diff}=|V_{filter\_set}-V_{filter\_reset}|$ that determines the switching of transistor TPs 540 such that:

If $V_{diff}<V_{TP}$, TPs 540 is kept OFF. This is the case when an input pulse of width $v<\omega$ is applied to sel-set input signal 538 of RS latch 533,535.

If $V_{diff}>=V_{TP}$, TPs 540 is kept ON. This is the case when an input pulse of width $v>=\omega$ is applied to sel-set input signal 538 of RS latch 533, 535.

Using the construction shown in FIGS. 5b and 5c of the MHS-RS flip-flop set and reset function, there is always an input pulse which is wide enough to set MHS-RS flip-flop 505. This proves the pulse stream to single pulse conversion theorem (see Appendix B).

B. Pulse Streams

Conventional schemes based on flip-flops produce a single pulse inside the region QR(*p)∪ER(*p) to excite a latch. Generally, either a multi-level logic layer is used to construct a complex element acknowledgment network or an SOP core is used with certain constraints on the SG representation (e.g., with the Monotonous Cover (MC) requirement). These methods are limited to distributive semi-modular SGs, and, a solution is not guaranteed to exist.

According to the present invention, a pulse stream is used instead of a single pulse to execute the MMS-RS flip-flop, and the n-shot architecture is not held to be fully speed independent. All semi-modular (distributive or non-distributive) SGs that satisfy CSC (e.g., race-free) can be mapped to the n-shot architecture (see Appendix B for formal proof).

Conventional synchronous logic minimization methods can be used to produce SOP logic networks 501, 503. Generated SOP networks 501, 503 may produce hazards that are manifested as pulse streams. Each pulse stream is converted into one single +p (−p) transition at the output of the MIS-RS flip-flop 505. No pulse stream used to fire +p (−p) can continue rippling at the input of MHS-RS flip-flop 505 after firing of −p (+p). To implement these requirements, a protocol is used in MHS-RS flip-flop 505.

1. Flip-flop Protocol

The SEL-SET 527 and SEL-RESET 529 AND gates with SDline and RDline inputs 507,509, respectively, and the additional literals added to each product of the SET and RESET SOP solutions serve as a control mechanism that paces the switchings of each SOP core 501,503. A flip-flop protocol forces the SOP cores 501,503 to exchange status information such that one core proceeds only when the other core is in a known state. In general, the SOP cores in the prior art C-element based architectures are separated and do not exchange status information.

In the operation of MHS-RS flip-flop 505 a +firing is a change in output signal OUT 508 from 0 to 1; and a −firing is a change in output signal OUT 508 from 1 to 0. SET-SOP core 501 (RESET-SOP core 503) is the SOP logic, with additional literals and sum terms, used to +fire (−fire) MHS-RS flip-flop 505. The SET 501 and RESET 503 logic cores, exchange status information through the asynchronous MHS-RS flip-flop 505. When the SET input is at ONE and output signal OUT 508 is at ONE, if the RESET input goes to ONE, OUT 508 remains unchanged. OUT will only switch OFF after the SET input turns OFF.

The MHS-RS flip-flop 505 operates in three modes:

1. In the set-mode, MHS-RS flip-flop 505 can be +fired and cannot be −fired, i.e., if it is at ZERO, it may +fire else if it is at ONE, it remains at ONE.

2. In the reset-mode, MHS-RS flip-flop 505 cannot be +fired and can be −fired, i.e., if it is at ONE, it may −fire else if it is at ZERO, it remains at ZERO.

3. In the quiescent-mode, MHS-RS flip-flop 505 can neither +fire nor −fire. It keeps its current value.

The sequence in which events must occur in order to change the state of the flip-flop is a "protocol" or an implicit mechanism where the SET 501 and RESET 503 cores exchange status information. Given an output signal, p, the n-shot protocol operates cyclically with the following operations:

1. set mode: p+ is fired (while the excitation region ER(+p) is traversed).

2. quiescent-mode: the SET-SOP cubes stabilize—the circuit overrides the environment.

3. reset-mode: p− is fired (while the excitation region ER(−p) is traversed).

4. quiescent-mode: the RESET-SOP cubes stabilize—the circuit overrides the environment.

And the cycle repeats.

Because all gates stabilize while the quiescent region (QR) is traversed (i.e., after +p has fired), the environment can proceed concurrently with the gate stabilization phase without waiting for any new p output event. Also, the n-shot architecture is autonomous during the stabilization phases, i.e., it completely overrides the environment.

2. Set Mode

In the set-mode, flip-flop 505 output signal OUT 508 is at ZERO and a stream of pulses tries to +fire it. In this phase, a hazardous SET-SOP response is converted into a single +firing by filtering the hazards as discussed above. This is achieved with the MHS-RS flip-flop 505. MHS-RS flip-flop 505 has a delay response of t and the setting of output signal OUT 508 to ONE is controlled by a threshold time value $\underline{w}$ such that given $$\text{sel-set}(t) = \Pi(t, v > 0), \text{out}(t) = \begin{array}{ll} 0 & \text{if } \underline{w} > v \\ H(t - \underline{t}) & \text{if } v \geq \underline{w} \end{array} \quad \text{Eqn. 1}$$

Where v and t are time-based parameters, and H is a step function (see Appendix A, Gate Pure Delay Model). The resetting of OUT 508 to ZERO is symmetric to the setting of OUT 508 to ONE. The resetting of flip-flop 505 output signal OUT 508 to ZERO is controlled by a threshold time value $\underline{w}$ such that given $$\text{set-reset}(t) = \Pi(t, v > 0); \text{out}(t) = \begin{array}{ll} 1 & \text{if } \underline{w} > v \\ 1 - H(t - \underline{t}) & \text{if } v \geq \underline{w} \end{array} \quad \text{Eqn. 2}$$

Thus, MHS-RS flip-flop 505 does not transmit a pulse shorter than threshold value $\underline{w}$ (thereby implementing inertial behavior) and for pulses larger than $\underline{w}$ the output response is simply translated forward in time by $\underline{t}$ (thereby implementing pure delay behavior). A trigger requirement is imposed on MHS-RS flip-flop 505 that ensures that for every output event, a pulse must exist that can +fire and −fire the flip-flop. When the trigger requirement is satisfied, MHS-RS flip-flop 505 transforms a SOP pulse stream into a single transition (for the trigger requirement theorem see Appendix B).

3. Quiescent Mode

After MHS-RS flip-flop 505 has +fired, it enters a quiescent mode. Here, MHS-RS flip-flop 505 can neither +fire nor −fire. It cannot +fire because the output OUT 508 is already at ONE. It cannot −fire because the SEL-RESET AND gate 529 is disabled.

C. n-shot Delay Requirement

As determined by operation of MHS-RS flip-flop 505, the semi-modular SG has a fixed traversal sequence: ER1(+p), QR1(+p), ER2(−p), QR2(−p), ER3(+p), QR3(+p), etc. (see above flip-flop protocol). By definition, at each ER an event p must be fired, and at each QR p remains stable. At the moment p+ is fired in ER1(+p) by some pulse, the environment is allowed to step forward at any speed and go across QR1(+p) and reach ER2(−p). However, pulses produced in ER1(+p) must not go across ER2(−p). If the pulses go across the succeeding ER2(−p) and reach QR2(−p) where −p has already fired, one of the pulses may +fire p and thus +p may misfire in QR2(p−).

Two delay lines, called SET delay line (SDline) 507 and RESET delay line (RDline) 509, with delays $td_{SD}$ and $td_{RD}$, respectively, are used to force gate stabilization in order to avoid misfirings.

Time delays $td_{SD}$ and $td_{RD}$ are determined as follows. The worst case SET-SOP input fork skew delay (561$i$–561$j$) is $td_{worst-set-fork}$. The worst case RESET-SOP input fork skew delay (571$n$–571$m$) is $td_{worst-reset-fork}$. The worst case SET-SOP cube delay (581$i$–581$j$) is $td_{worst-set-cube}$ and the SET-SOP OR gate 513 has a delay $td_{set-or}$ 583. The worst case RESET-SOP cube delay (591$n$–591$m$) is $td_{worst-reset-cube}$ and the RESET-SOP OR gate 517 has a delay $td_{reset-or}$ 593. Delay requirements for SOP gate stabilization are:

$td_{SD} > [td_{worst-set-fork} + \max(td_{worst-set-cube}, td_{set-or})]$ and $td_{RD} > [td_{worst-reset-fork} + \max(td_{worst-reset-cube}, td_{reset-or})]$ As the delay requirement is one-sided and the order of magnitude for the delays is on the range of a worst case gate delay plus wire delay, the delay requirements can generally be achieved.

Stabilization is accomplished in two steps: first, after p+ fires, all SOP AND gates 511$i$–511$j$, are stabilized at ZERO and OR gate 513 at ONE; and second, after p− fires, OR gate 513 is turned OFF. Thus, if the delay requirements, $td_{SD}$, is satisfied and the quiescent-mode can be exited with all SOP cubes 511$i$–511$j$, stable at ZERO and OR gate 513 stable at ONE. This is because in the quiescent-mode MHS-RS flip-flop 505 can neither +fire nor −fire. MHS-RS Flip-flop 505 cannot +fire because the output is already ONE. Flip-flop 505 cannot −fire because the SEL-RESET AND gate 529 is disabled. In order to enable MHS-RS flip-flop 505 and move to the reset-mode, the SEL-RS flip-flop module 521 must change its state which only happens after SDline 507 +fires, which occurs after +p fires. Because the +p ripples through SDline 507 slower than through any SET-SOP gate 511$i$–511$j$, 513 (due to the delay requirement), all gates 511$i$–511$j$, 513 are stable when SDline 507 +fires.

After p− fires, there are two cases to consider:

1. When the quiescent mode is exited, both the SET-OR gate 513 and the SDline 507 are stable at ONE. SOP AND gates 511$i$–511$j$ are OFF, and the SEL-set AND gate 527 is disabled. After −p has fired, SDline 507 ensures that SET OR gate 513 is OFF before SEL-set AND gate 527 is enabled again. Otherwise +p may misfire.

2. When the environment has reacted very fast and reached a new ER(+p) by the time −p is rippling, and SET-AND gates 511$i$–511$j$ are enabled much before SET-OR 513 gate is turned OFF, then by the time SDline 507 turns OFF, SET-OR gate 513 may be in any state, because a number of pulses may have already rippled through the SET-AND gates 511$i$–511$j$. However, this is not a problem because when the new ER(+p) is reached, MHS-RS flip-flop 505 must in fact +fire.

The n-shot architecture is autonomous during the stabilization phases, i.e., it completely overrides the environment. This means that no constraints propagate from the n-shot architecture to the state graph level.

The n-shot architecture shown in FIG. 5$b$ is not speed independent, however, it is assumed that internal gates and wires can have any delays (wire forks are not required to be isochronic). In addition, I/O wires must have a constant delay, a one-sided internal delay constraint must be satisfied ($td_{SD}$ and $td_{RD}$), the pure delay model is assumed, and gate and flip-flop atomicity is required (no hazards introduced in construction of the gates and flip-flop). Delay lines, SDline 507 and RDline 509, are not in the critical path and generally do not affect the speed of the circuit.

The n-shot architecture enables some comparisons with the synchronous operating environment. In a synchronous case, if the critical path is slower than the time imposed by the clock frequency, either the logic speed needs to be increased or the clock frequency needs to be decreased. Similarly, in the asynchronous case either the logic speed needs to be increased or critical time relations are corrected by adding delay ($td_{SD}$ and $td_{RD}$). Using the n-shot architecture, delays are added out of the critical path by force of the design of the timed protocol. And, it is always possible to correct delay mismatches to recover the timing imposed by the architecture. Using the concept of a protocol, delay compensations are made over sets of gates rather than on a gate to gate basis.

D. Mapping SOP Solutions to the n-shot Architecture

Figure 8A:
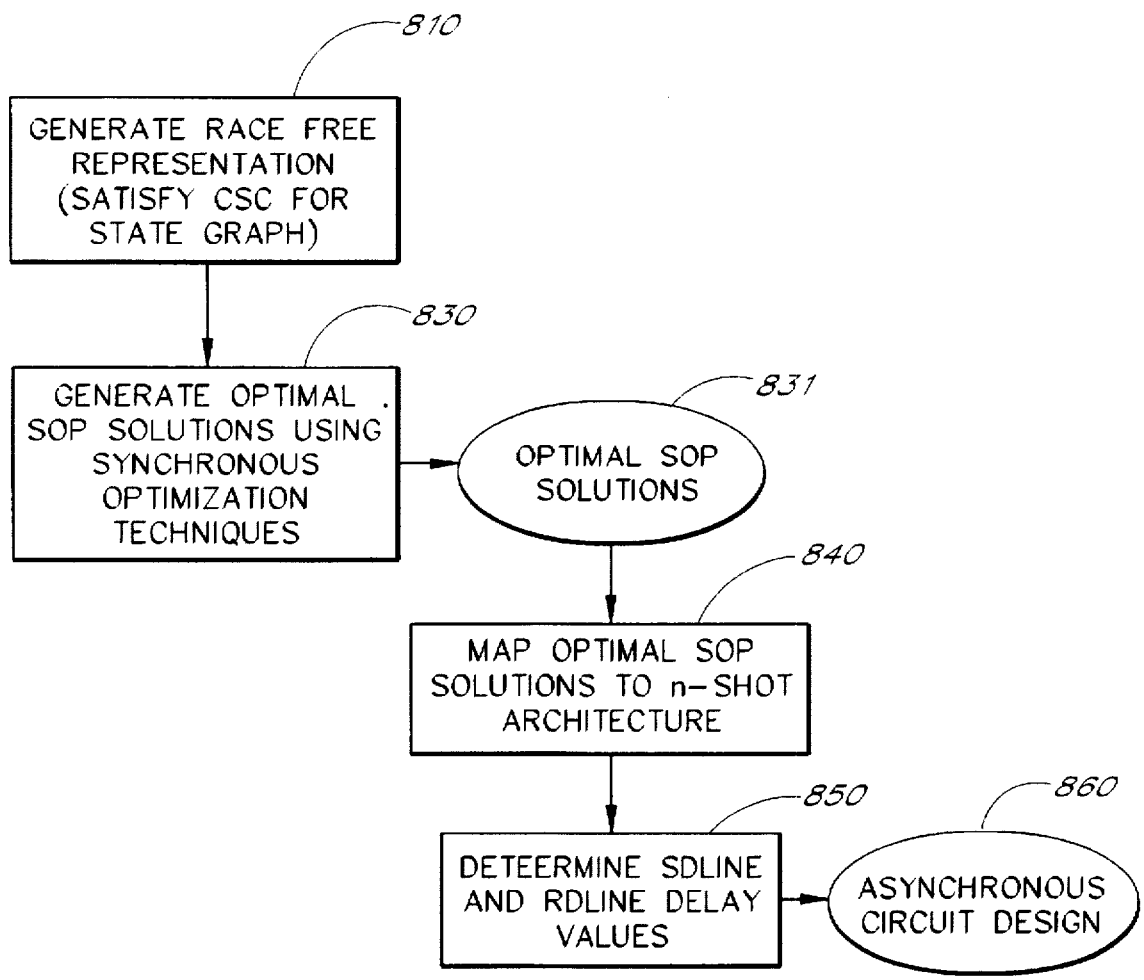
FIG. 8a illustrates the n-shot asynchronous synthesis design method of the present invention.

Using the n-shot architecture of the present invention as discussed above, a new method for asynchronous design synthesis procedure is employed. Referring to FIG. 8$a$, a race-free representation of the particular asynchronous process is generated 810. In an SG model representation, a race-free representation corresponds to satisfying the CSC requirements using a general state assignment method (which is independent of the SG class).

Because the model is race-free, a hazard-free implementation is guaranteed using the n-shot architecture. Therefore, the representation can be optimized using standard synchronous optimization and minimization tools which are indifferent to hazards. For example, Expresso-Exact, a commercially available synchronous SG optimization product generates exact optimal SOP solutions.

Figure 8B:
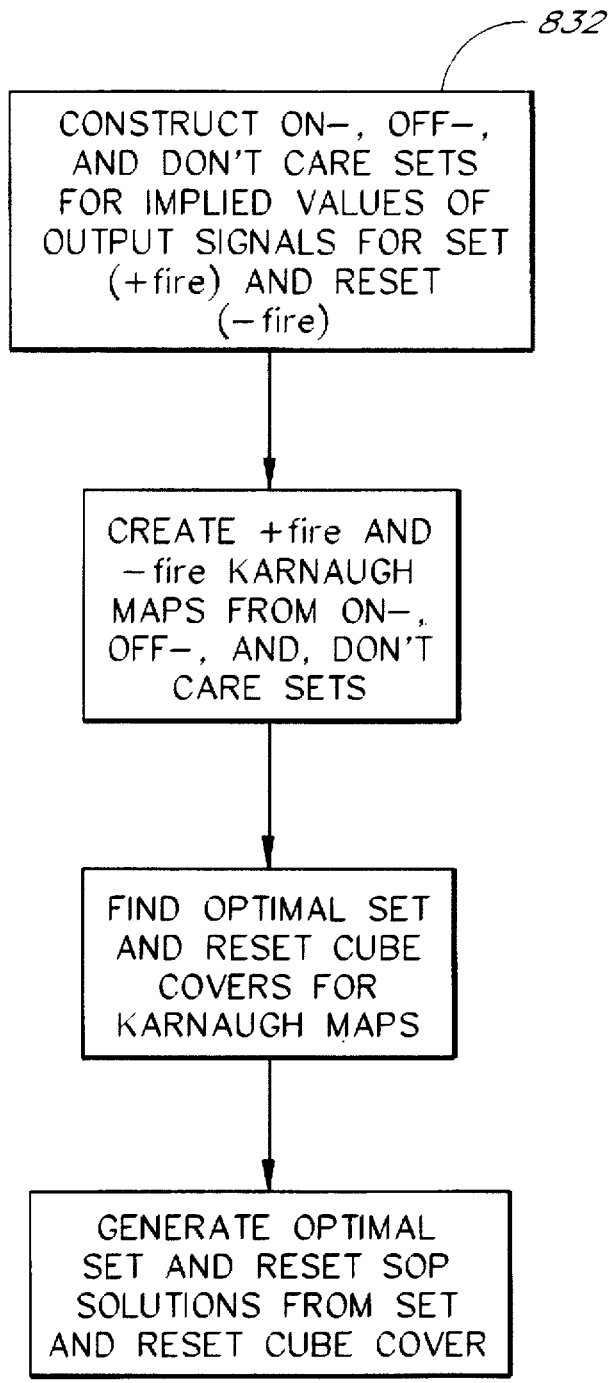

SET and RESET-SOP solutions 831 are generated 830 from the optimized representation 820. For a single traversal SG, no constraints are added to find the optimal solution. Referring to FIG. 8b, SET and RESET SOP solutions 831 are generated 830 by creating ON-, OFF-, and DON'T CARE sets of implied values for each non-input signal 832. For example, for the SET SOP of an output signal p, each state where p=0* is placed in the ON-set; each state where p=1* or 0 is placed in the OFF-set; and, each state where p=1 and all unreachable states are placed in the DON'T CARE set (the circuit overrides the quiescent region). The RESET SOP for output signal p is similarly constructed: each state where p=1* is placed in the ON-set; each state where p=0* or 1 is placed in the OFF-set; and each state where p=0 and all unreachable states are placed in the DON'T CARE set (the circuit overrides the quiescent region). Karnaugh maps for the +firing and −firing of the output signal are constructed from the ON-, OFF-, and DON'T CARE sets for the SET and RESET functions, respectively 833. Optimal cubes that cover the +fire and −fire Karnaugh maps are derived 834. The +fire and −fire cube covers correspond to the optimal logical SOP solution of the SET and RESET functions, respectively 835. An example construction of a circuit is described below in Section VI.

The optimal SET-SOP and RESET-SOP solutions 831 are mapped into the n-shot architecture 840 as discussed above. I.e., a literal, ¬p (p), is added to each SET (RESET) product term and an additional product, p (¬p) is added to the sum of the SET (RESET) solution.

Finally, delay values $td_{SD}$ and $td_{RD}$ are determined for SDline 507 and RDline 509 from the circuit components in SOP cores 501,503 (850). The delay requirements, $td_{SD}$ and $td_{RD}$, depend on a library and on routing information, not on the specification. A fixed value for the delay lines is determined form a library when an estimate on the worst case routing and gate delay is available (see above). A worst case can always be computed to satisfy the delay requirement.

Thus, the design paradigm to develop a logic core to obtain an asynchronous circuit is radically changed. The prior art methods rely on the fact that all hazards must be removed in the logic because they may propagate through a C-element in the architecture. In the present invention, an electrical inertial barrier is established such that a pulse can only be transferred when enough energy is used to cause the transfer. An internal self-acknowledging delay-based protocol is also used to force gate stabilization. Using this approach, the SOP core can be hazardous. Thus, synchronous logic minimization tools can be used to design the logic cores. Such a procedure is proved to be valid without restrictions for a large semi-modular SG class compared to other methods.

III. N-SHOT+ ARCHITECTURE

The n-shot architecture is able to make CSC a necessary and sufficient condition for hazard-freeness, and an SOP solution that can be mapped to the n-shot architecture is guaranteed to exist.

However, the n-shot architecture requires an added literal (via the feedback lines) for each product term 511*i*–511*j*, 515*n*–515*m* in the SOP solution. Thus, the size of the MHS-RS flip-flop can be larger than the equivalent C-element solution. The n-shot+ architecture optimizes the n-shot architecture by eliminating the SOP solution delay lines and eliminates RS latch 523, 525, thus the SOP core of the n-shot+ architecture is minimal. The basic element of the of n-shot+ architecture is a modified cascaded master-slave (MHS) flip-flop.

A. MHS Latch

Figure 6A:
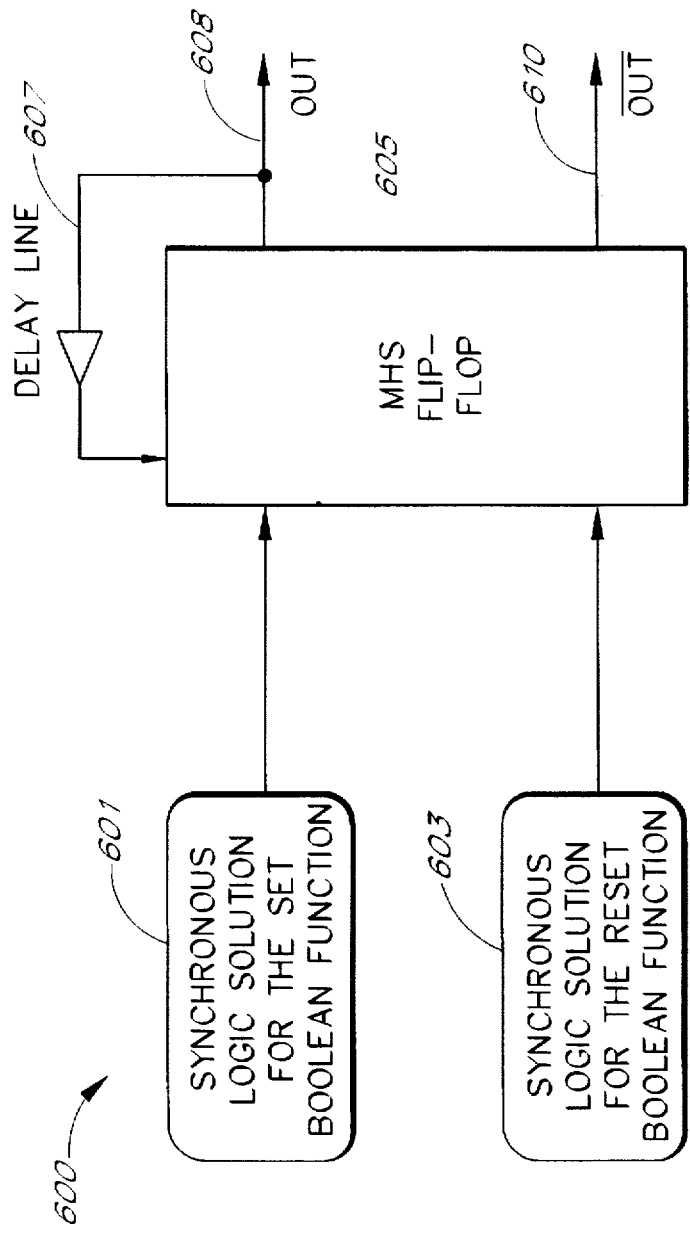
FIG. 6a is a high-level block diagram of the n-shot+ architecture in accordance with one embodiment of the present invention.

A high-level block diagram of the n-shot+ architecture is shown in FIG. 6a. The n-shot+ architecture 600 is divided into three major parts: two SOP solutions, SET 601 and RESET 603, that can have hazards; a delay line 607; and MHS flip-flop 605. N-shot+ flip-flop 605 produces output OUT 608 and ¬OUT 610.

Figure 6B:
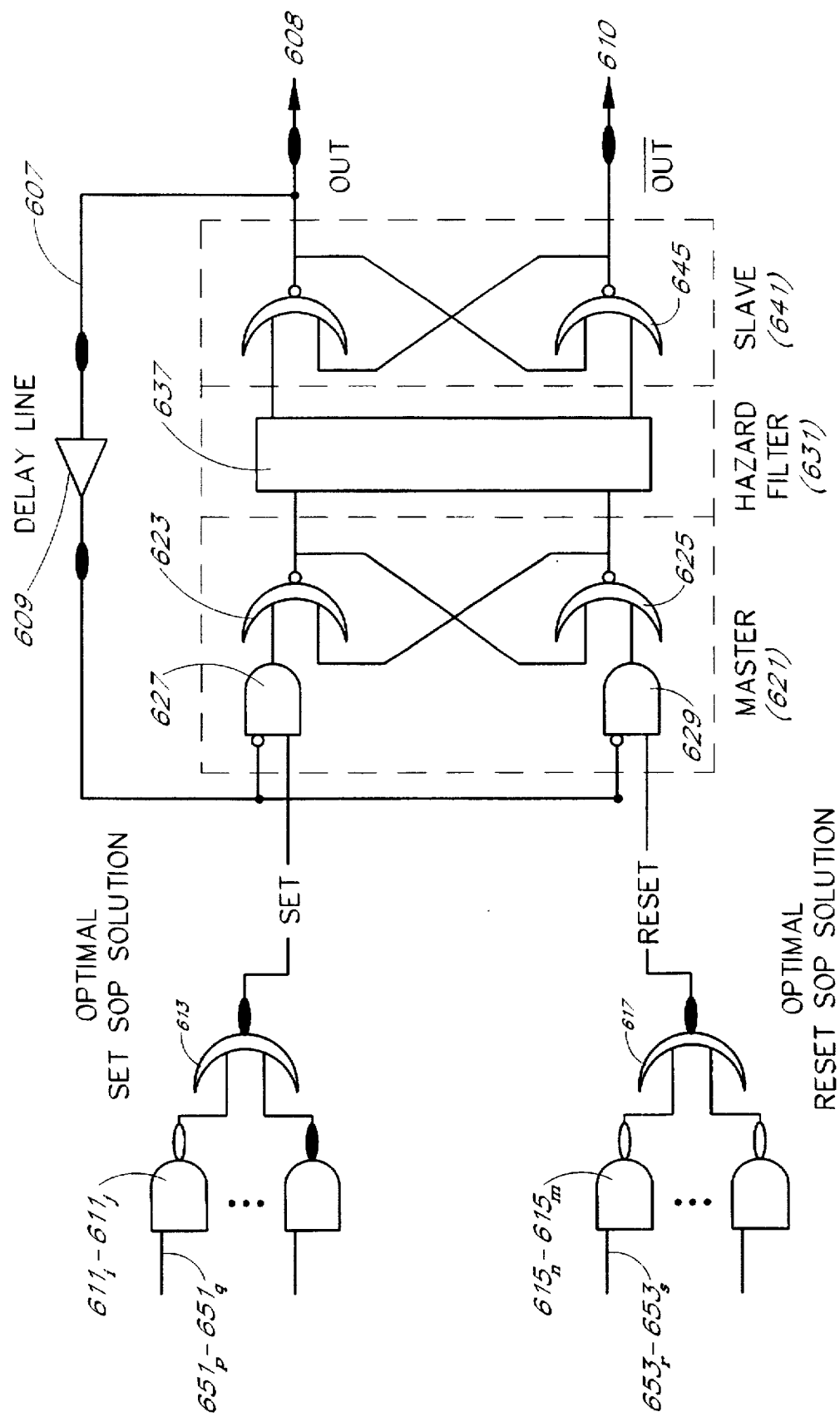

FIG. 6b is a general logic circuit diagram of the n-shot+ architecture 600. As with the n-shot architecture 500, each particular implementation of the n-shot+ architecture will vary according to the SOP solutions of the particular problem at hand. Signal inputs of the asynchronous process 651*p*–651*q*, 653*r*–653*s* are variously entered in the SET 611*i*–611*j* and RESET 615*n*–615*m* SOP AND gates according to the derived SOP logic solution. The SET-SOP solution comprises a series of AND gates 611*i*–611*j* ("products") and an OR gate 613 ("sum"). Similarly, the RESET-SOP solution comprises a series of AND gates 615*n*–615*m* and an OR gate 617. Unlike the n-shot architecture, there are no delay feedback lines to the SET and RESET logic solutions.

MHS flip-flop 605 comprises three basic modules: master RS latch 621, hazard filter 631, and slave RS latch 641. Master RS latch 621 makes a pulse width to analog voltage conversion. Master RS latch 621 comprises two AND gates 627, 629, and an RS latch 623, 625. AND gates 627, 629 has input SET- and RESET-SOP solutions 601, 603, respectively (i.e., from OR gates 613, 617, respectively). AND gate 627 also has input of the negation of delay line signal 607 from output signal 608. AND gate 629 has input of delay line signal 607. Delay line signal 607 is also run through a no-op function 609 for delay. In addition to the cross-coupled input, NOR gates 623, 625, have input from the output of AND gates 627, 629, respectively. See below for time delay of delay line 607.

Hazard filter 631 eliminates non-digital voltage conversions and passes digital +firings and analog −firings. Hazard filter 631 is a 4-transistor filter (see FIG. 7c for transistor implementation). Hazard filter 631 has input from the output of NOR gates 623, 625 and is the same as the filter 537 used in the n-shot architecture.

Slave RS latch 641 produces only digital values and uses a fixed 4-code conversion protocol to avoid misfirings. In addition to the cross-coupled input, slave RS latch NOR gates, 643, 645 have input from the output of hazard filter 631. NOR gates 643,645 output signals OUT 608 and ¬OUT 610, respectively.

Figure 7A:
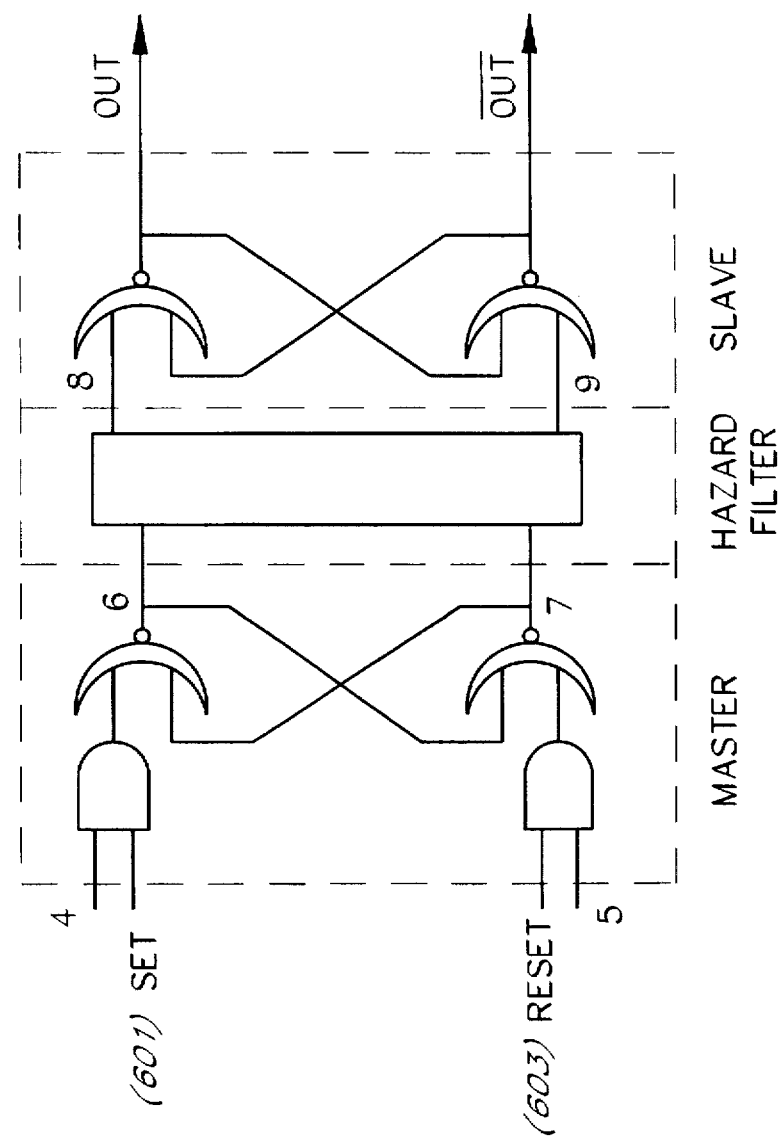
FIG. 7a illustrates the connections for a transistor embodiment of the n-shot+ architecture as shown in FIGS. 7b–7d.
Figure 7B:
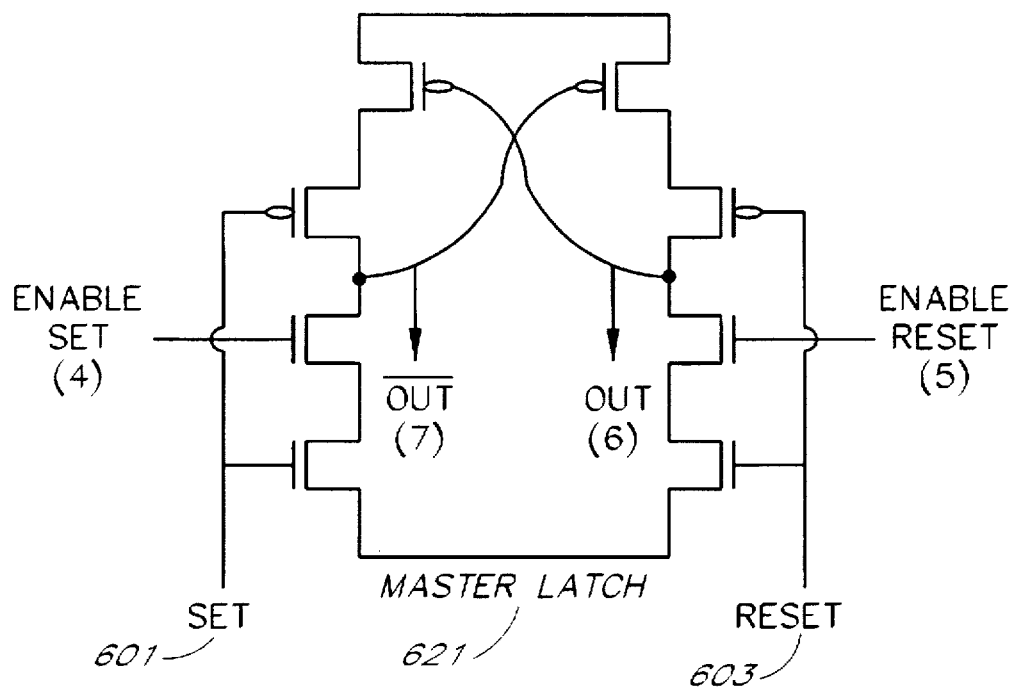
FIG. 7b is one embodiment of a transistor implementation of the n-shot+ master latch of the present invention.

In one embodiment, MHS flip-flop 605 is implemented using transistors. FIG. 7a illustrates the connections (4,5,6, 7,8,9) of one embodiment of MHS flip-flop for the transistor implementation shown in FIGS. 7b–d. In FIG. 7b, master latch 621, is composed of 8 transistors that implement the enabling of the SET 601 and RESET 603 lines (i.e., from OR gates 613, 617, respectively), as well as the pulse width to voltage conversion. If a pulse of width $\underline{w}$ is applied at the SET input 601 of master latch 621, then the response through the hazard filter 637 has the following linearized response $V(\underline{w})$:

$$V(\underline{w}) = VDD - \lambda \underline{w} \qquad \text{Eqn. 3}$$

where λ is a conversion factor.

The linearized response of Eq. 3 is one embodiment of a pulse to voltage conversion; a non-linear conversion can also be employed. The voltage conversion is analog, i.e., a pulse is converted into some voltage that may not have a digital value of ZERO or ONE. If non-digital values are propagated, information loss may occur. Thus, only a subset of converted values that represent a digital value should be propagated. Filter 631 performs this function.

Figure 7C:
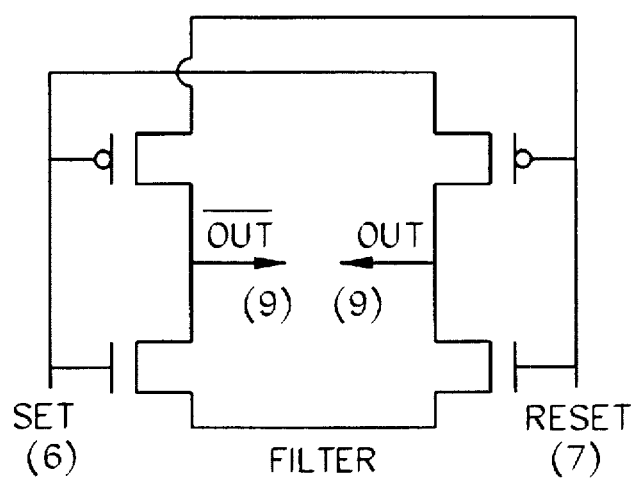
FIG. 7c is one embodiment of a transistor implementation of the n-shot+ master filter of the present invention.

FIG. 7c shows one embodiment of filter 631 implemented using transistors. Filter 631 comprises 4 transistors. The filtering of the non-digital values is done by using a virtual VDD that corresponds to the outputs 6, 7 of master latch 621. Filter 631 works in conjunction with slave latch 641 that embeds a 4-code protocol.

Figure 7D:
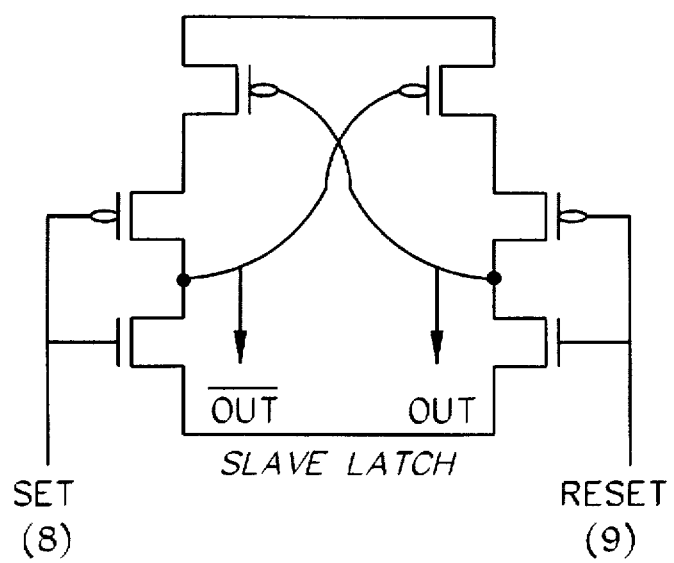
FIG. 7d is one embodiment of a transistor implementation of the n-shot+ slave latch of the present invention.

FIG. 7d shows one embodiment of slave latch 641 implemented using transistors. Slave latch 641 is constructed using 6 transistors, and has the following behavior:

| set, reset | out |
|---|---|
| 0,1 | 1→0 |
| 0,Vx | 0 |
| 1,0 | 0→1 |
| Vx,0 | 1 | where Vx is any analog voltage. The signals set, reset, and out transition, respectively, from (0, Vx, 0) to (1, 0, +) to (Vx, 0, 1) to (0, 1, −) and back to (0, Vx, 0).

A 4-code conversion protocol is as follows:

1. (0;1;+) and (1;0;−) codes represent a *firing;
2. (0;Vx;0) and (Vx;0;1) codes represent stability. This represents the fact that when the slave latch is already reset (or set), a Vx input tries to reset it (or set it). As it is already reset (set), nothing happens. For (0;Vx;0) or (Vx;0;1), the zero values for the set or reset inputs are stable (non-hazardous +firing of the filter).

The protocol forces the code transitions to have a fixed form: (0;1;−) to (0;Vx;0) to (1;0;+) to (Vx;0;1) to (0;1;−).

MHS flip-flop 605 has several important properties. It is immune to input hazards as shown above. It behaves like a C-element. A C-element uses a digital protocol with the codes: (0;1;−), (1;0;+), (0;0;0), (0;0;1), (1;1;0), (1;1;1). The (0;1;−) and (1;0;+) codes are the same as those of the MHS flip-flop. The C-codes (1;1;1) and (1;1;0) correspond to the MHS-codes (Vx=0;0;1) and (0;Vx=0;0). When both inputs are at ONE, both outputs of the master latch are cleared. This forces the outputs of the filters to be cleared. This is reflected with Vx=0. The C-codes (0;0;0) and (0;0;1) correspond to the MHS codes (0;Vx=1;0) and (Vx=1;0;1). When only one input pulses, the master latch will keep its previous value after a state change. Thus Vx is kept at ONE. Also, the MHS flip-flop 605 is immune to fast feedback lines. That is, if a +firing (−firing) of the MHS flip-flop disables the set (reset) input then the +firing or the −firing of the MHS flip-flop is not affected by the disabling of the set (reset) inputs.

B. n-shot+ Delay Requirement

As with the n-shot architecture, a pulse stream must be converted into a single output transition, and after an output event +p has fired, a pulse stream must not go across the excitation region ER(−p), i.e., no pulses used to fire +p can continue rippling after −p has fired (called a trespassing pulse which causes a misfire).

MHS flip-flop 605 converts a pulse stream into a single transition in the same way as the n-shot architecture in the MHS-RS flip-flop 505. However, avoiding misfirings due to trespassing or spurious pulses cannot be solved by the MHS flip-flop alone, because the flip-flop depends on the SOP time responses. Therefore, a delay requirement must be satisfied to avoid misfirings.

In order to avoid a trespassing pulse, acknowledgment of the transitions of each gate of the SET 601 and RESET 603 SOP solutions is required. A signal to signal acknowledgment (as in the n-shot architecture) is substituted by a delay based global acknowledgment, i.e., after a given settling time, each gate of a SOP core is guaranteed to be in a known state. The trespassing pulse problem only appears in the SET-SOP solution 601 (RESET-SOP solution 603) after MHS flip-flop 605 has +fired (−fired). Before the +firing (−firing), there can be no misfiring because the environment waits for a +firing (−firing).

In the n-shot+ architecture 600, a trespassing pulse rippling through the SET-SOP solution 601 is avoided if the SET-SOP solution 601 (i.e., from output of OR gate 613) settles to ZERO before the SET input of the MHS flip-flop 605 is enabled. Thus, a trespassing pulse does not go across an excitation region and a misfiring does not occur.

The SET-SOP solution 601 takes t_worst-settle+ to completely settle to ZERO after an ER(−p) is entered. The fastest RESET-SOP solution 603 time response that causes the MHS flip-flop to reset is t_−fast. The MHS −firing response is t_−firing. From the moment ER(−p) is entered, RESET-SOP 603 can get excited and cause MHS flip-flop 605 to −fire and cause SET-SOP 601 to be enabled again. Thus, the fastest time for the enabling of the MHS set input is:

t_enable-set=t_−fast+t_−firing.

Thus, the condition that must be satisfied is:

t_worst-settle+<t_enable-set.

In order to guarantee that the inequality is always satisfied a delay line 607 with delay t_delay-line is used wherein, t_delay-line>t_worst-settle+−(t_−fast+t_−firing)

Figure 6C:
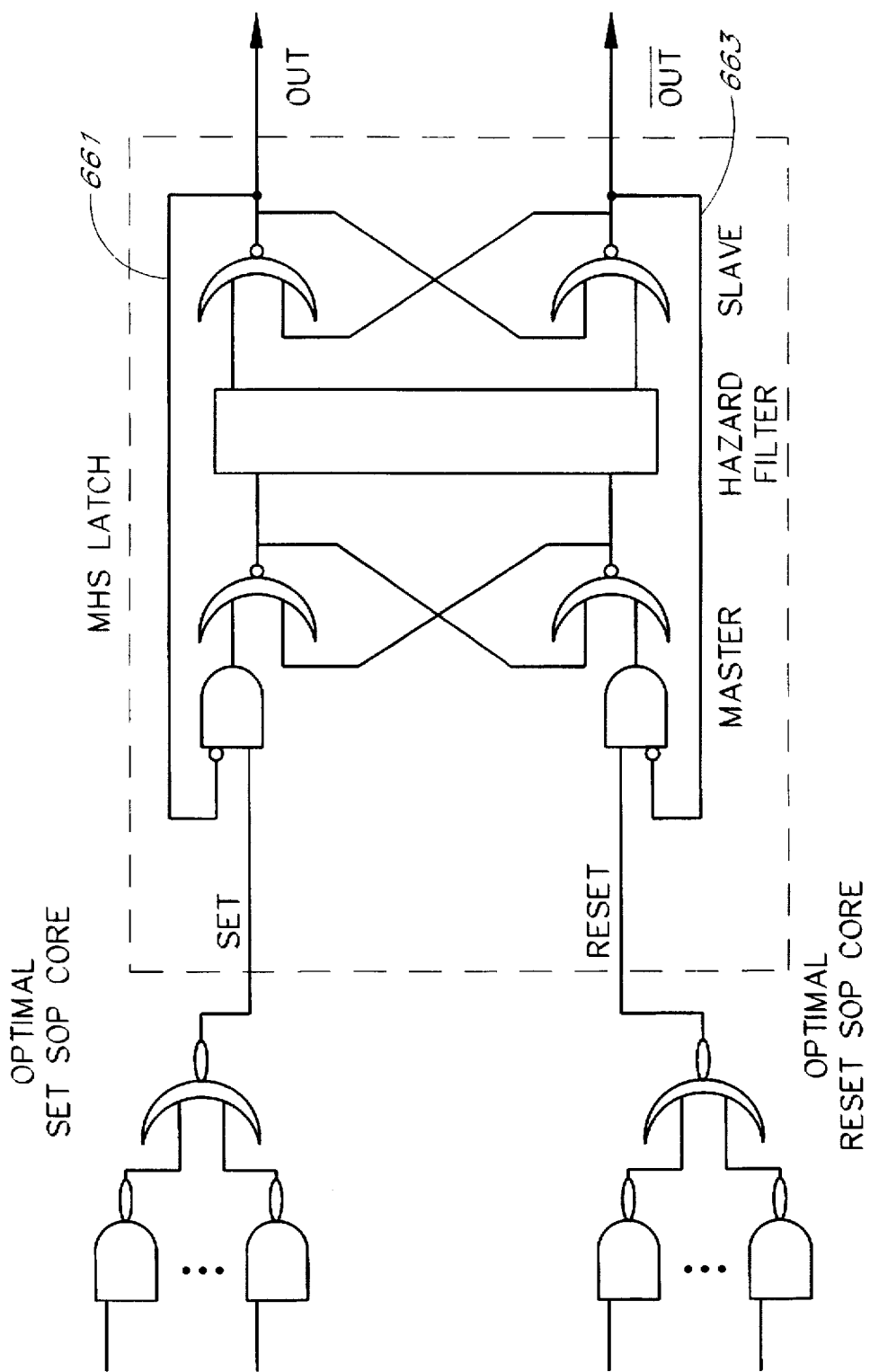
FIG. 6c is a logic circuit diagram of the n-shot+ architecture with delay balanced feedback lines.

For this inequality three regions can be identified:

1. A region where delay line 607 is not necessary. This happens when t_worst-settle+<t_enable-set. In this situation, delay line 607 can be eliminated and negated feedback connections 661, 663 used instead as shown in FIG. 6c.
2. A region where a solution is always guaranteed to exist regardless of the set enabling time. This happens when t_delay-line>t_worst-settle+(assuming, conservatively, that t_−fast=t_−firing=0).
3. A region where the delay line value is 0<t_delay-line<t_worst-settle+. The architecture sufficient for cases 2 and 3 is shown in FIG. 6b.

The determination of a delay time for delay line 607 can be better estimated when actual gate and routing delay information is available. However, the order of magnitude for the delay line values can be theoretically determined. There is an upper bound value of t_worst-settle+ that corresponds to the delay through two gates in a SOP implementation (i.e., an AND gate 611i–611j, 615n–615m, and an OR gate, 613, 617). The time requirement is estimated by the difference of the worst case time propagation through a SOP solution and the fast case propagation plus the flip-flop delay. In practice, the value of the delay line 607 is on the order of a gate delay.

Figure 8C:
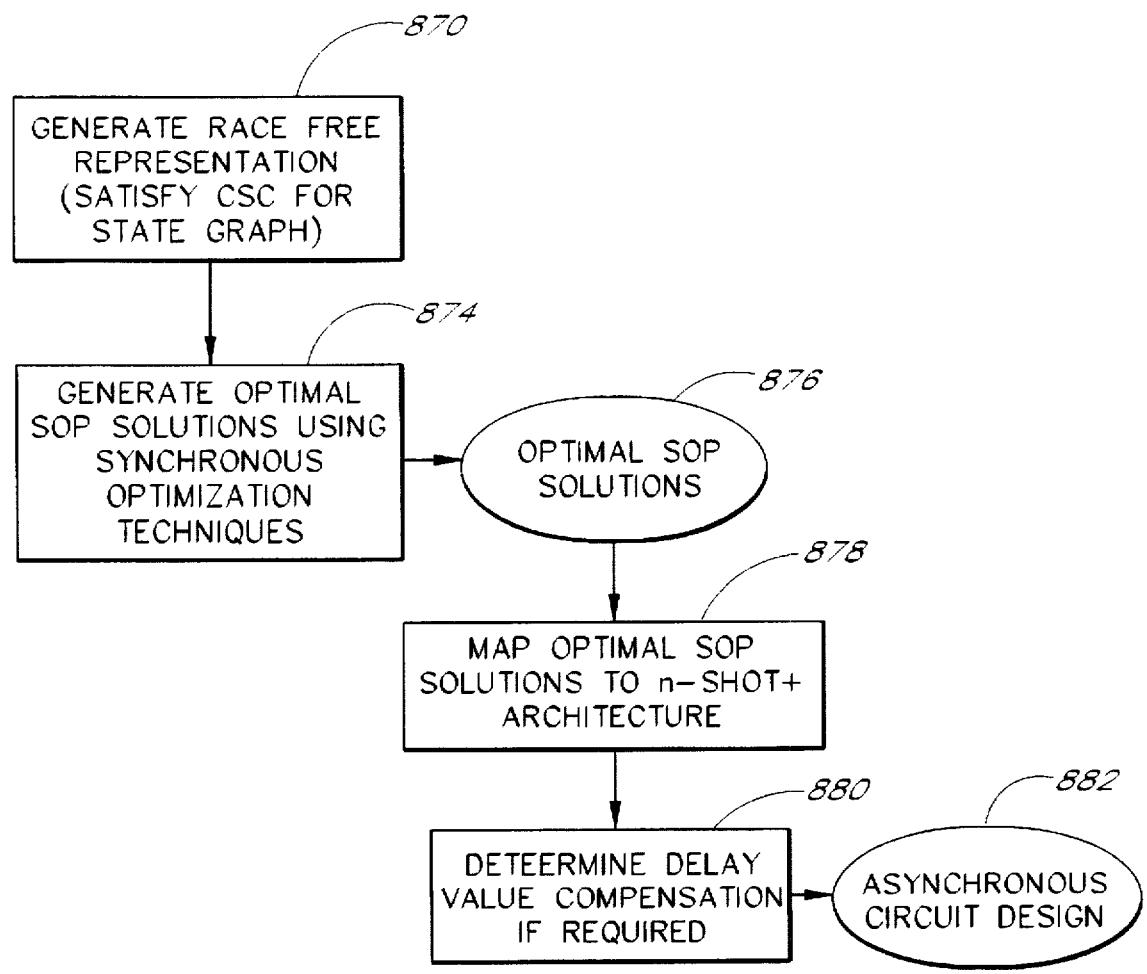
FIG. 8c illustrates the n-shot+ asynchronous synthesis design method of the present invention.

C. Mapping SOP Solutions to n-shot+ Architecture Mapping SOP solutions 601,603 to the n-shot+ architecture is more straightforward than with the n-shot architecture. Referring to FIG. 8c, a race-free representation of the particular asynchronous process is generated 870 (e.g., an SG model representation that satisfies CSC). SET and RESET-SOP solutions 876 are generated according to the procedure in FIG. 8b, using synchronous minimization and optimization tools 872 (e.g., using Espresso—Exact). Unlike the n-shot architecture, no further modification is required to map SOP solutions 876 to the n-shot+ architecture (i.e., no literals or additional products are required). SET and RESET SOPs 876 are added to the circuit implementation via the connection of OR gates 613, 617 to AND gates 627,629, respectively (878). Finally, a value for delay line 607 is calculated, if a delay line is required 880.

IV. OPTIMIZATIONS

The present invention enables a radical change in the design of asynchronous circuits. Asynchronous circuits can be optimized in two respects.

1. Optimal SOP Solutions (synchronous-phase optimizations)
2. Optimal Architectures (asynchronous-phase optimizations)

A. SOP Optimization

As discussed above, since the SOP solution can be hazardous, it can functionally be treated as a synchronous circuit. (Synchronous design is indifferent to hazards because a clock is used). Thus, existing synchronous logic synthesis methods can be used to solve asynchronous problems. SOP optimizations for power, area, or speed are guaranteed to have a mapping to the n-shot (or n-shot+) architecture. Therefore, designers of asynchronous circuits can utilize synchronous tools to directly manipulate the logic without having to add extra constraints to compensate for the hazard problem.

B. Architecture Optimization

According to the methods and apparatus described herein, the optimal SOP solutions (SET and RESET) are derived and plugged into the n-shot or n-shot+ architectures as SOP cores. Using the n-shot and n-shot+ architectures, a circuit is guaranteed to exist given any single traversal SG that satisfies CSC.

However, other architectures (e.g., Hard Cover (HC), Monotonous Cover (MC), one-shot, auto__C) also utilize an SG, and derive SOP cores from the SG to generate an asynchronous logic circuit. Depending on the characteristics of the SG, these other architectures can also be used to implement the asynchronous process. Thus, although a solution is guaranteed to exist using the n-shot (n-shot+) architecture, a more specific and simplified architecture may be used if certain SG conditions are met. In other words, the architecture can be optimized to fit the derived optimal SOP solution (referred to as architectural optimization).

Architectural optimization can be obtained by checking whether the SG solution satisfies a set of conditions associated with a given architecture. These conditions are referred to as architectural conditions. In other words, the SG is classified based on the characteristics of its structure, and an architecture is chosen based on the SG characterization or class.

Figure 9:
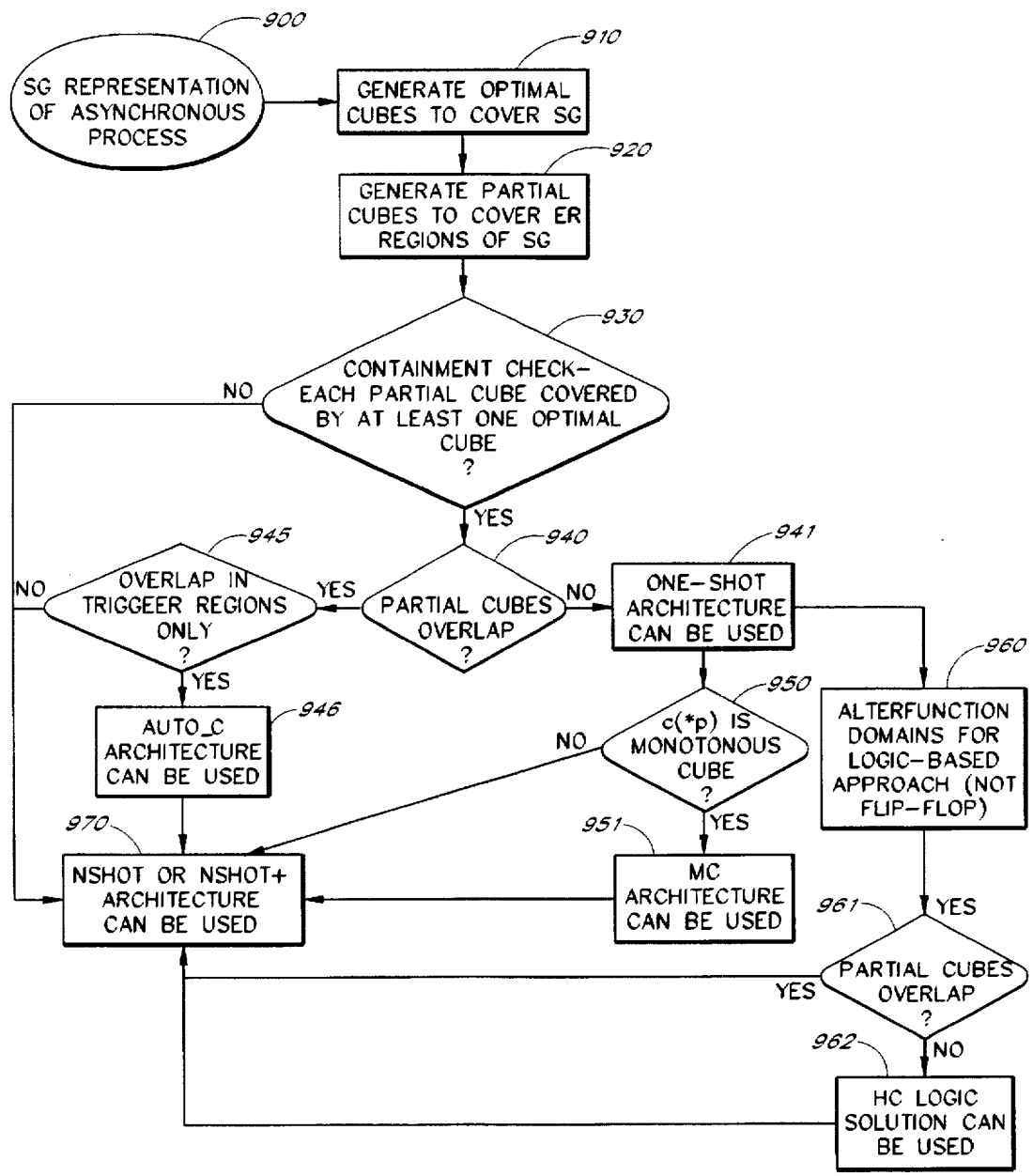
FIG. 9 illustrates the method for architectural optimization of the present invention.

A formal presentation of the required checks for various architectures is described in Appendix C. Referring to FIG. 9, a procedure to generate an optimal architecture is shown. A set of optimal cubes to cover the SG representation of an asynchronous process 905 is generated 910. (See Appendix C for formal definition of cube cover).

A set of cubes 921 that satisfy the excitation regions (ER) of the SG representation, called partial cubes, is generated 920. In the example alternative architectures described herein, it is not necessary to check cube coverage over the quiescent region, QR, because the environment is overridden during the traversal of any QR(*p). However, other architectures are possible and checks that stem from QR characteristics can also be employed to discern the correct architecture. Partial Cubes are described more formally in Appendix C.

A query is made as to whether each partial cube is contained by at least one optimal cube. This is called the containment check 930. See Cube Containment in Appendix C. If the containment check 930 is not satisfied, no further optimization is possible and the asynchronous process SOP solution is mapped to either the n-shot 500 or n-shot+ 600 architecture 970—see above.

If the containment check 930 is satisfied, then alternate architectures are possible. If no partial cubes overlap 940, then the one-shot requirements are satisfied (necessary and sufficient), and the optimal SOP can be mapped to the one-shot architecture 941. If the one-shot requirements are not satisfied 940, then MC and HC will also fail.

If the overlapping states of partial cubes 920 occur only in trigger regions 945, then the auto__C requirements are satisfied (necessary and sufficient), and the optimal SOP can be mapped to the auto__C architecture 946.

If the one-shot requirement is satisfied 940, more specific architectures are also possible. For the monotonous cover (MC) requirement, each optimal cube 910, c(*p), is checked against all states of any QR(*p), to verify if c(*p) is a monotonous cube (distributive SGs only) 950. If so, then the MC architecture can be used 951.

To test for the hard cover (HC), the function domains are altered 960 to reflect that HC is a pure logic solution. The DON'T CARE set only contains unreachable states (i.e., it does not include 1 for SET, and 0 for RESET). The one-shot requirements above are then imposed—i.e., no overlap of partial cubes 961. If satisfied, the SOP can be implemented in pure logic 962 (not a flip-flop).

In all cases, the n-shot or n-shot+ architectures still guarantee a hazard-free implementation and can be used 970. Similarly, other architectures (e.g., HMC) and their corresponding requirements can be tested for satisfaction.

The simplicity of the procedures in the form of containment and overlap checks is obtained via the formalization of the necessary and sufficient requirements for each architecture. Optimization occurs in two distinct steps: the SOP core is optimized and for the optimal SOP core (e.g., using synchronous tools such as expresso-exact), then various checks are made to determine which architecture fits into the optimal SOP core.

V. EXAMPLE

Figure 10A:
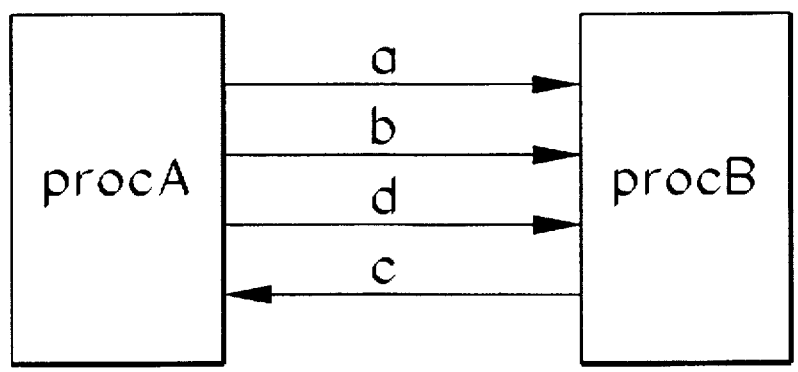
Figure 10B:
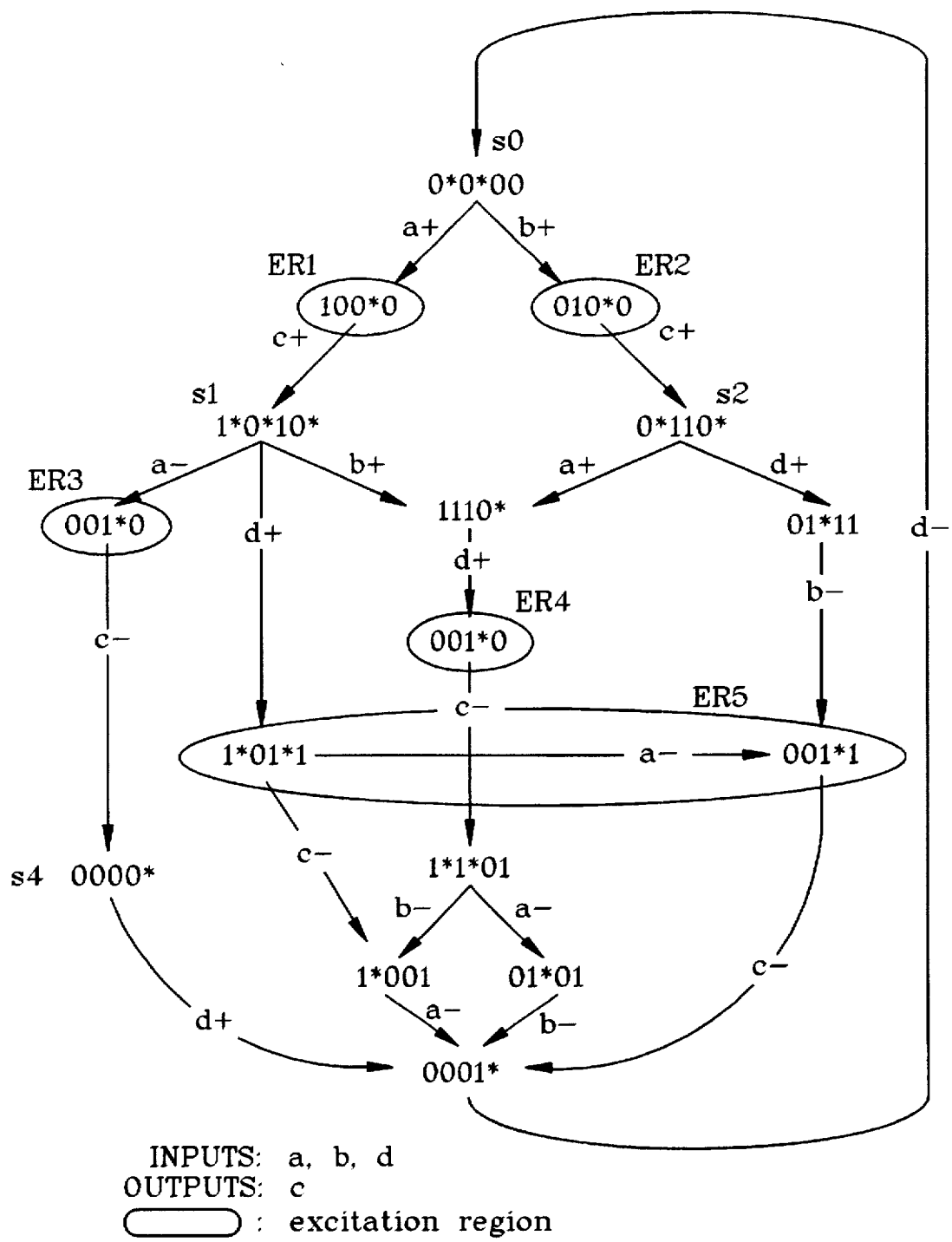

In FIG. 10a two processes A and B communicate such that process A is considered as the environment and process B the circuit to synthesize. Process B has inputs a, b, and d, and output signal c. FIG. 10b is an example semi-modular state graph with input choices that shows the excitation regions of signal c for the process in FIG. 10a. The input choices at states s__0, s__1, s__2 are made by process A. Although states s__0 and s__4 have the same codes, their next state behavior is decided by process A (thus there is no mutual exclusion). Thus, the SG satisfies CSC. Note that state 1100 is an unreachable state.

For each approach (HC, MC, one-shot, auto__C, n-shot), a Karnaugh map is shown that demonstrates how the conditions and requirements of the approach restrict the covering of the map.

A. The HC requirement

Figure 10C:
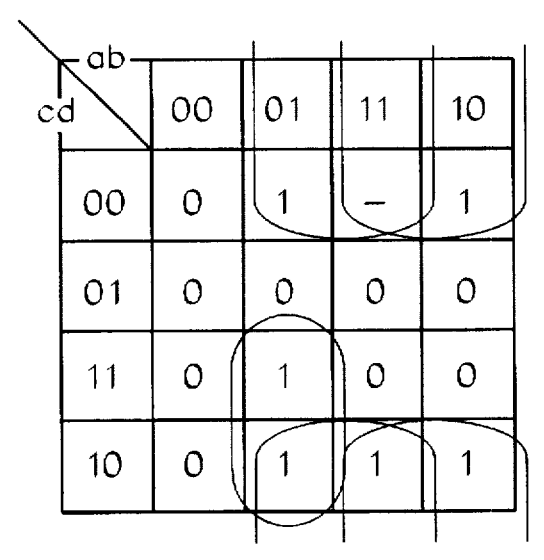

Under the hard cube (HC) requirement, a single cube to cover the entire ON-SET space of c (i.e., fire +c) is required. FIG. 10c is an example Karnaugh map of the ON-set function of signal c under the hard cover (HC) requirement for the example in FIG. 10b. As shown in FIG. 10c, at least three cubes are required to cover the SET space. Since the overlap, the HC requirement is not met. Consequently, there is no pure logic SOP solution that exists under speed independence.

B. The MC requirement

Figure 1B:
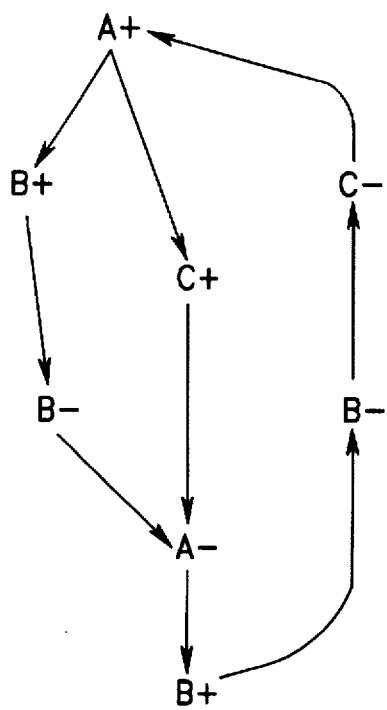
Figure 1D:
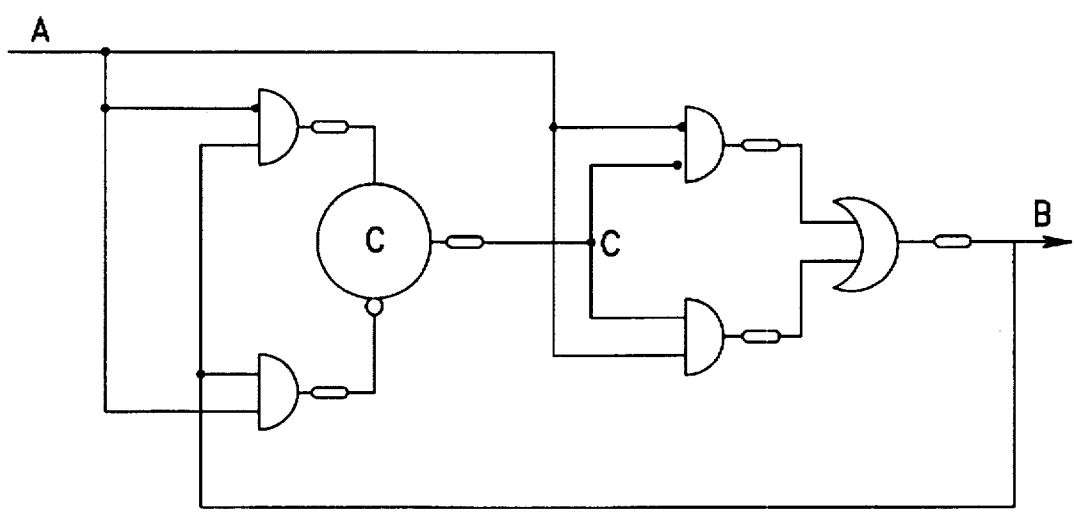
Figure 10E:
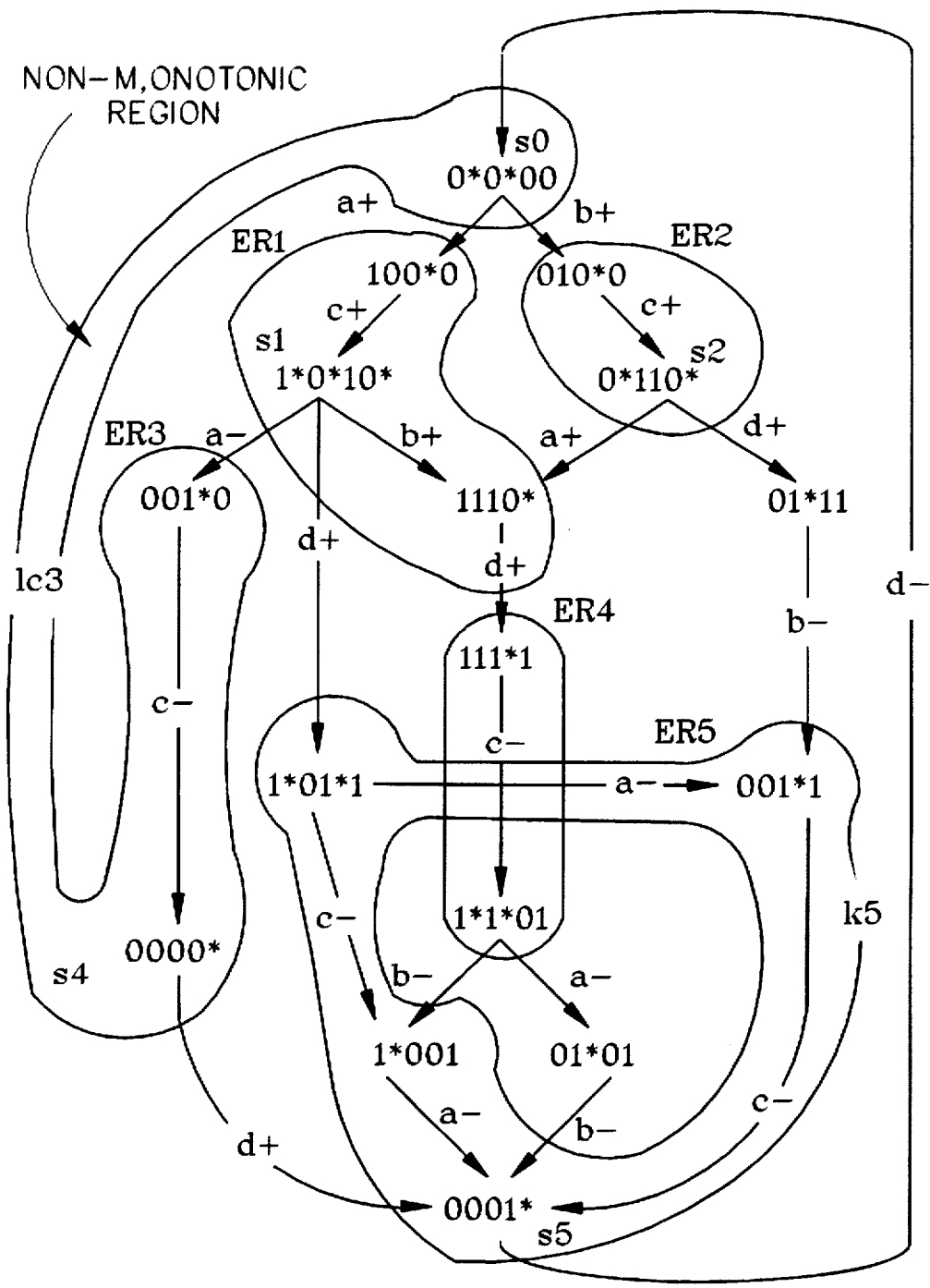

Under the Monotonic Cover (MC) requirement, covers may not overlap, and the covers must be monotonic. FIG. 10d-1 and FIG. 10d-2 are example Karnaugh maps of the ON- and OFF-set functions, respectively, of signal c under the monotonous cover (MC) requirement for the example in FIG. 10b. As shown, the non-overlapping condition is satisfied. However, the MC condition is not satisfied. This can be seen in the state graph illustrated in FIG. 10e. Cube k_3 covers states s_0 and s_4, however they are not covered contiguously (i.e., they are non-monotonous). That is, in order to reach s_0 from s_4, s_5 must be passed through and s_5 is not covered by k_3. The SG is a nonmonotonous hard SG, i.e., no matter how many state signals are added, a cube will always nonmonotonically cover states s_0 and s_4. Thus, the MC requirement is not satisfied.

C. The one-shot requirement

Figure 10F:
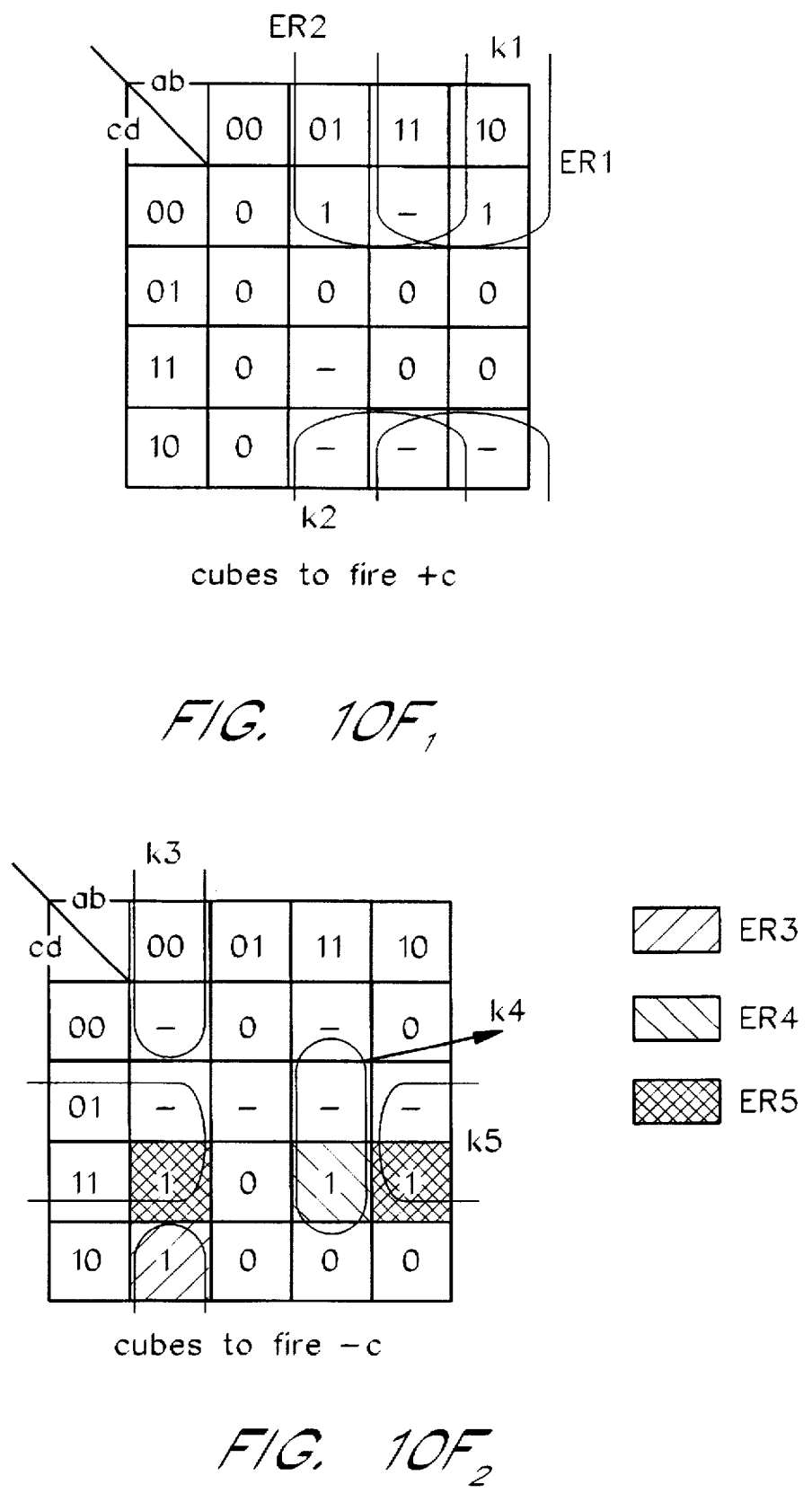
Figure 10G:
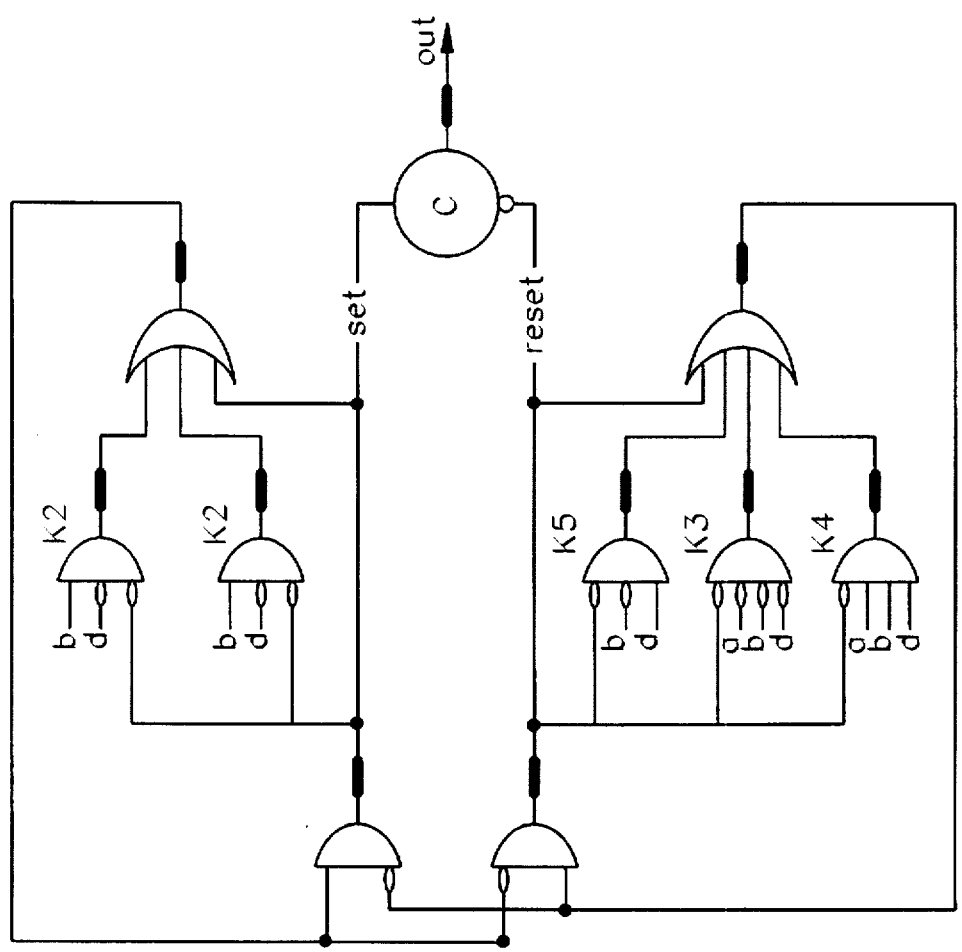
Figure 101:
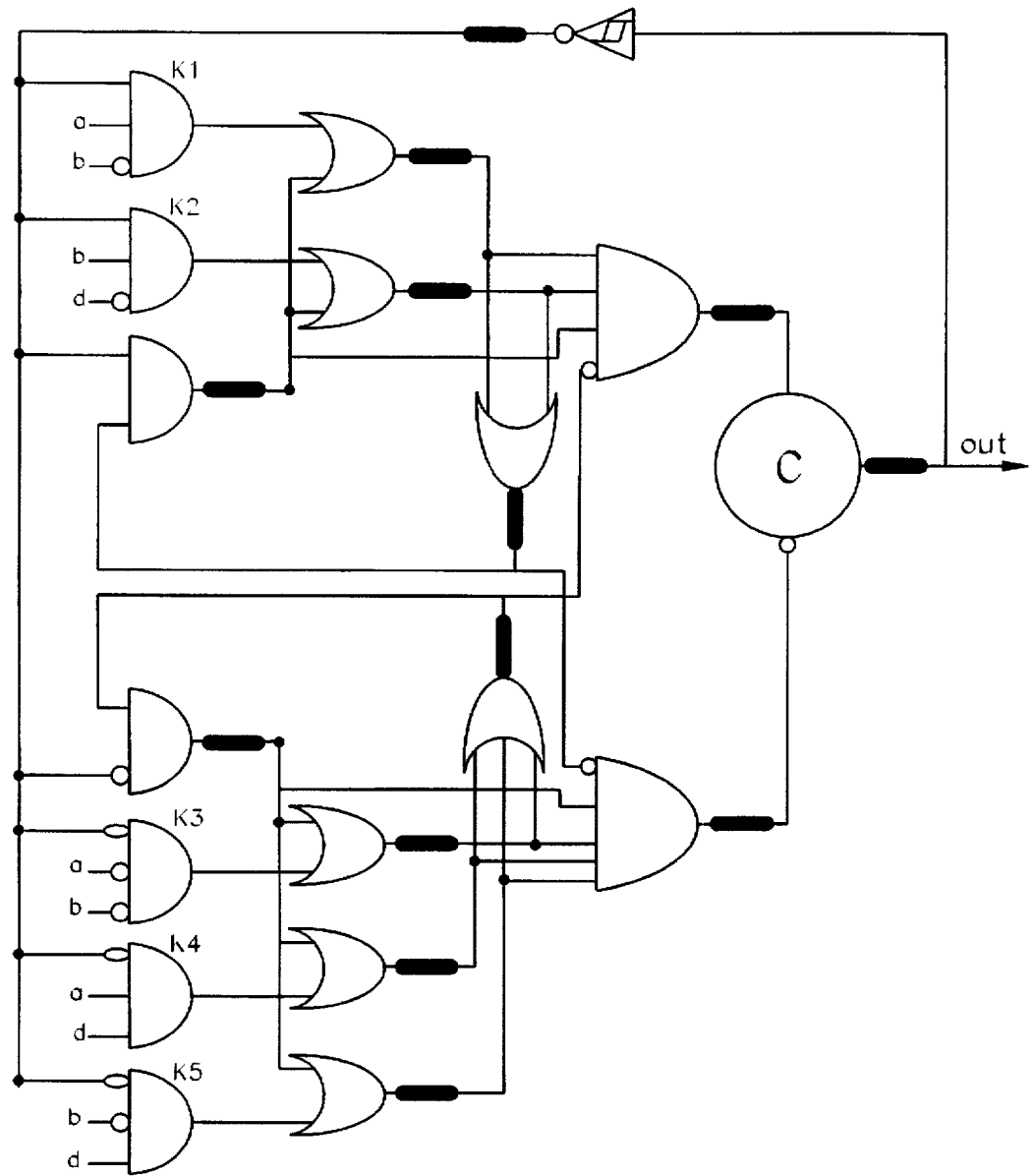

Under the one-shot requirements, cube covers CAN overlap in any quiescent region (DON'T CARE) state, and non-monotonicity is allowed, however, cube covers may NOT overlap in excitation regions. FIG. 10f-1 and FIG. 10f-2 are example Karnaugh maps of the ON- and OFF-set functions, respectively, of signal c under the one-shot requirement. As opposed to the MC requirement example above, cube k_2 can be expanded, and k_3 can be non-monotonic. Thus, the one-shot requirement is satisfied. The circuit is conventionally implemented in SOP cores from the Karnaugh maps and is mapped onto the fixed one-shot architecture. FIG. 10g is an example logic circuit diagram of the one-shot architecture implementation of signal c.

D. The auto_C requirement

Under the auto_C requirements, an overlap of cube covers for excitation region states is allowed (trigger regions), but each (partial) excitation region must be covered by one cube. FIG. 10h-1 and FIG. 10h-2 are example Karnaugh maps of the ON- and OFF-set functions, respectively, of signal c under the auto_C requirement. Here, k_3 and k_4 can be expanded, and the auto_C requirement is satisfied. The circuit is conventionally implemented in SOP cores from the Karnaugh maps and is mapped onto the fixed auto_C architecture. FIG. 10i is an example logic circuit diagram of the auto_C architecture implementation of signal c.

As requirements are relaxed, (from the HC to MC to one-shot to auto_C), there is more flexibility to expand cubes. However, even under auto_C, the cover is not equivalent to an optimal cover (in an optimal cover, cube k_5 can be eliminated), and the SG space is limited to less than the race-free semi-modular distributive SG solution space (i.e., less than the CSC SG space).

E. The n-shot Requirement

Figure 10J:
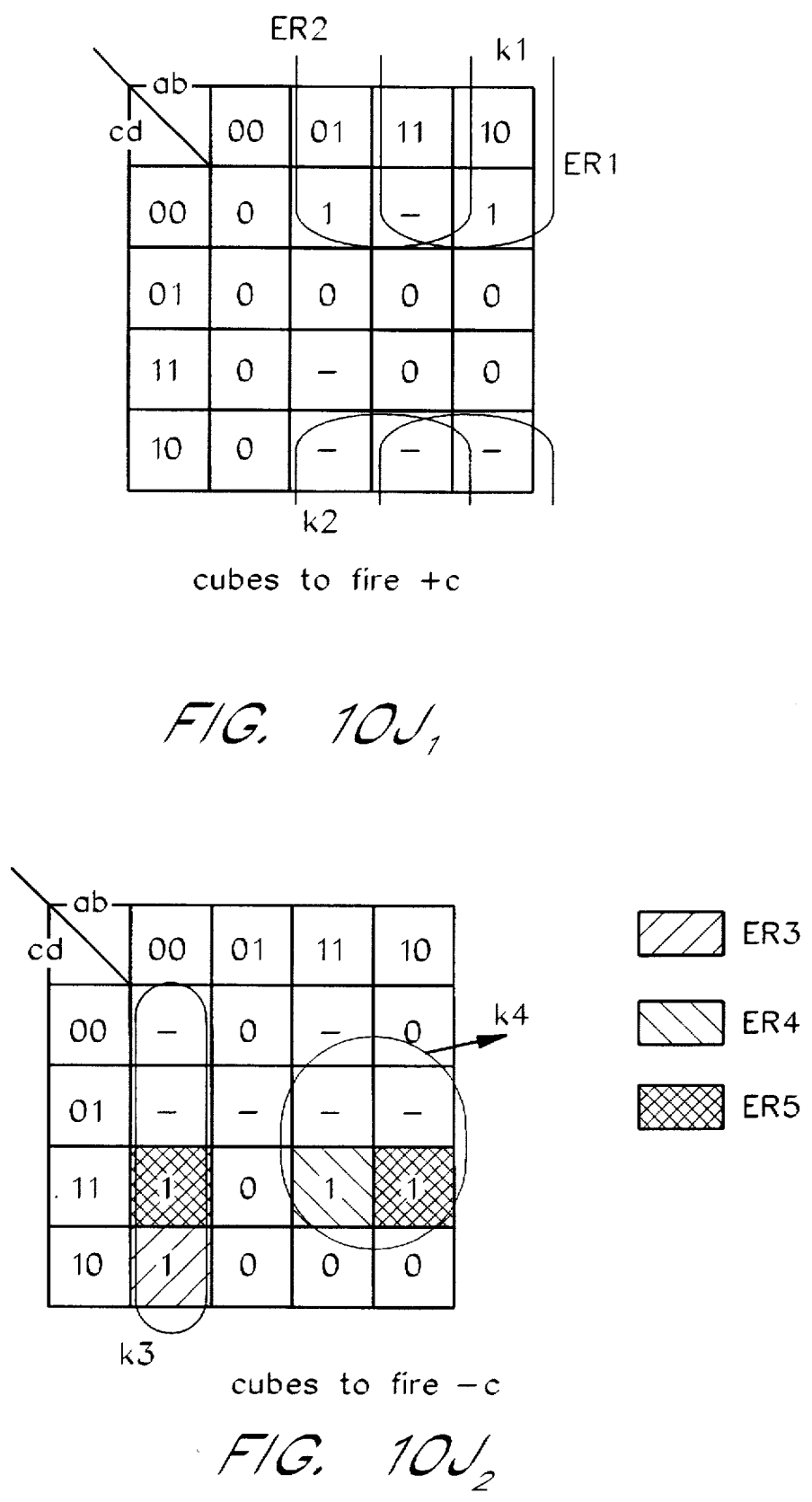
Figure 10K:
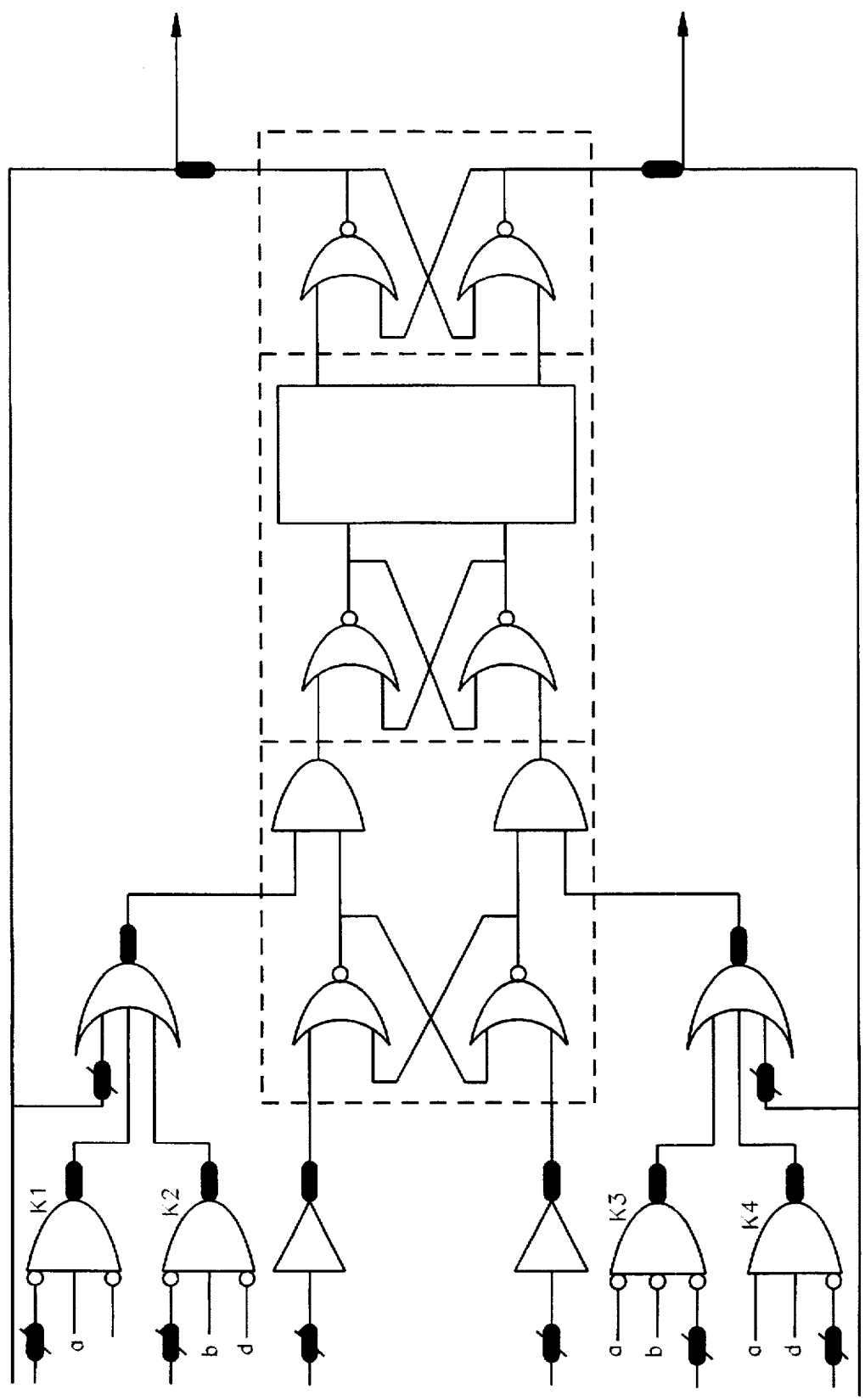

Under the n-shot requirement, overlap of cube covers is allowed for both excitation and quiescent regions, there is no requirement to cover each (partial) excitation region, and the solution can be nonmonotonic. In summary, the architecture will admit any SG solution that satisfies CSC. Thus, the minimal SOP core can be implemented on the n-shot architecture. FIG. 10j-1 and FIG. 10j-2 are example Karnaugh maps of the ON- and OFF-set functions, respectively, of signal c under the n-shot requirement. The optimal cube cover is achieved under the n-shot requirements as cube k_5 is eliminated as compared to the auto_C cover. The circuit is conventionally implemented in SOP cores from the Karnaugh maps and is mapped onto the fixed n-shot architecture. FIG. 10k is an example logic circuit diagram of the n-shot architecture implementation of signal c.

F. N-shot+

The n-shot+ logic solution reveals the same SOP solution, but is mapped onto the n-shot+ architecture. The circuit is conventionally implemented in SOP cores from the Karnaugh map and mapped onto the fixed n-shot architecture (i.e., as shown in FIG. 6b).

Table I summarizes the various approaches and their requirements as discussed above.

TABLE I

| Requirement | Implementation | Single Cover | Cube Overlap | Monotonic | S-M SG Class |
|---|---|---|---|---|---|
| HC (N&S) | SOP | ER + QR | NO | YES | distributive |
| MC (S) | SOP + C | ER | NO | YES | distributive |
| HMC (S) | SOP + C | ER | YES(a) | YES | dist. & non-dist. |
| DC (S) | SOP + RS | ER | YES(b) | YES | dist. & non-dist. |
| one-shot-(N&S) | SOP + C | ER | NO | NO | distributive |
| auto_C (N&S) | logic network + C | Partial ER | YES(c) | NO | dist. & non-dist. |
| n-shot (N&S) | SOP + RS's | TR | ANY | NO | dist. & non-dist. |
| n-shot + (N&S) | SOP or SOP + C | one state | ANY | NO | dist. & non-dist. |

Legend
N&S = necessary and sufficient condition; S = sufficient condition;
(a) = only overlaps of set and reset cubes (HMC and full cubes);
(b) = only overlaps of set and reset cubes (DC and wire cubes);
(c) = only overlaps over a trigger region.
TR = trigger region Thus, the global strategy is to optimize the SOP logic and then check which additional property the SOP logic satisfies.

APPENDIX A

State Graphs

A state graph is a finite automation given by $G=(A,S,T,\delta,s_o)$, where the components are defined as follows: $A=A_I \cup A_O$ is the set of signals, $A_I$ is the set of input signals, and $A_O$ is the set of non-input signals, such that $A_I \cap A_O = \emptyset$. $T=\{+,-\} \times A \cup \{\epsilon\}$ is the set of signal transitions, where $\epsilon$ denotes a dummy transition, +a denotes the 0→1 transition of signal a, and −a denotes the 1→0 transition of signal a. $\delta: S \times T \to S$ is a partial function representing the transition function such that if $\delta(s,t)=s'$ is defined then t is said to be enabled in state s' and the firing of t takes the system from s to s'. $s_o \in S$ is the initial state. Each state in the state graph is labeled with a binary vector (s(1),s(2), . . . , s(n)) according to the signals $A=\{a_1,a_2, \ldots, a_n\}$ of the system. The labeling is given by a state assignment function $\lambda_A: S \times A \to \{0,1\}$. For a given state $s \in S$, s(i) denotes the value of signal $Q_c \in A$ in state s. For s, s' ∈ S and t ∈ T such that $$s \xrightarrow{t} s',$$

the state assignment function is defined as follows: (1) if s(i)=0^t=+a_i then s(i)=1; (2) else if s(i)=1^t=−a_i then s'(i)=0; (3) otherwise, s(i)=s'(i). If the states of the state graph can be encoded according to the above rules, then the state graph is said to have a consistent state assignment.

In a state s ∈ S, if a transition t is enabled, i.e., it is potentially going to fire, the corresponding signal $a_i$ is said to be excited (*). If a signal is not excited, it is said to be stable. Possible successor events for an excited signal a* currently 0*, are 0 (a gets stable), 0* (a continues to be excited), 1 (a switches on), or 1* (a switches on and gets excited to fall). Possible successor events for a stable signal a currently 0 are 0 (a continues to be stable), and 0* (a gets excited to rise). The time for any state change is indeterminate but finite. If a state s' is directly reachable from s by the firing of * p it is denoted by sE(*p)s'.

The SG semantic has three basic properties: (1.) determinism—in any state s, no two outgoing arcs have the same labels; (2.) commutativity—any two transitions that fire from a state s, interleave; (3.) persistency—no transitions can disable another transition.

Semi-modular SG with input choices

An SG is semi-modular with input choices if it is deterministic (no two outgoing arcs have the same labels), commutative, and output persistent (non-input transitions cannot be disabled). This class of SGs is a standard SG class for asynchronous representation.

Detonant State

Semi-modular SGs are classified based on detonant states. If $\exists$ s, $s_1 \neq s_2 \in S$ and $\exists$ a*,b*, c* $\in$ Tls E(a*) s1, s E(b*) s2 and c is stable in s and it is excited in both s1 and s2 then s is called detonant with respect to signal c.

Distributive SG

A semi-modular SG is said to be distributive iff there does not exist s $\in$ SG that is detonant.

Non-distributive SG

A semi-modular SG is said to be non-distributive iff $\exists$ s $\in$ SG that is detonant.

Regions

A semi-modular state graph can be divided into regions and bundled to capture the next state behavior of a given signal. At implementation, a link is made between the functionality of the regions and the physical gates implementing them.

Excitation region

An excitation region of a signal p, denoted as ER (*p), is a maximal connected set of states in which p has the same value and is excited. The excitation region corresponding to a specific transition *p is denoted as ER(*$p_i$).

Quiescent region

A quiescent region of a signal p is the maximal connected set of states directly reachable from ER (*$p_i$) by the firing of *$p_i$ in which p has the same value and is not excited. It is denoted as QR(*$p_i$).

Output Trapping

Once we enter an excitation region ER (*p), we can only leave it by the firing of *p. The proof follows from the fact that the graph is semi-modular.

Complete State Coding (CSC)

An SG satisfies CSC if and only if: 1. $\forall$s, s' $\in$ SG, s and s' have unique binary codes, or, 2. $\forall$s, s' $\in$ SGls and s' have identical binary codes, the set of excited output signals must be identical.

Gate Pure Delay Model

Consider an input function inp(t), an output function out(t), a gate function $\Pi(t,v)$ and a step function H(t), such that:

$$\Pi(t,v>0) = \begin{array}{l} 1 \text{ if } 0 < t < v \\ 0 \text{ if } v \leq t \leq 0 \end{array} \quad \text{and } H(t) = \begin{array}{l} 0 \text{ if } t < 0 \\ 1 \text{ if } t \geq 0 \end{array}$$

Given inp(t)=$\Pi$(t,v>0), we have: out(t)=$\Pi$(t–$\alpha$, v>0), $\forall \alpha$, v; where $\alpha$ is the delay of a gate or a delay line.

APPENDIX B

Necessary and sufficient n-shot conditions for hazard-freeness

Definition: Cyclic Region

A cyclic region is the maximal set of connected states of an excitation region such that any of its states can be traversed more than once without leaving the excitation region.

Definition: Trigger Region

A trigger region denoted as TR(*p) is the minimal set of connected states of ER(*p) such that once it is entered, we can only leave it by the firing of *p. A trigger region can be a single state or a cyclic region.

Lemma: Trigger Region Reachability

From any state of an excitation region, a trigger region is always reachable because of the definition of an ER, TR and the output trapping property.

Definition: Trigger Cube

A trigger cube, c, is a single cube that completely covers a trigger region.

Definition: N-shot Cover Cube

A cube cover c(+p) is an n-shot cover cube if 1. It covers a state of some ER(+p); and 2. It covers no states of any QR(–p) or ER(–p). Thus an n-shot cube can cover any states of any ER(+p) and any states of any QR(+p).

Definition: N-shot requirement

A semi-modular SG is said to satisfy the n-shot requirement if: (1.) for each state of every excitation region for a non-input signal, there corresponds an n-shot cube; and (2.) for every trigger region there corresponds an n-shot cube that is a trigger cube.

Lemma: SG trigger requirement

The trigger requirement is satisfied if and only if for every trigger region there corresponds a trigger cube. Sufficiency proof: As we traverse an excitation region, e.g., ER(+p), we can always reach a trigger region (see Trigger Region Reachability). As an n-shot cube is a trigger cube, once a trigger region is reached, and the trigger cube switches ON, it can only switch OFF after +p has fired because any reachable state inside a trigger region is covered by the same cube. Thus, a trigger cube produces a steady ONE value to excite the MHS-RS flip-flop and guarantees that the trigger requirement is always satisfied.

Necessity proof. Suppose a trigger region that is cyclic is covered by two n-shot cubes. Then inside the trigger region, we can move from one cube to another. A stream of pulses may be generated by continuously traversing these two cubes. As we do not require any cubes to produce pulses larger then the w threshold value of the MHS-RS flip-flop, then all the pulses of the stream might be shorter than the required w and although it is unlikely, we might then enter into a deadlock situation, because we cannot guarantee that the flip-flop will ever fire when excited by such a pulse stream.

Requirement: Firing Requirement

If we remain enough time in any state of any excitation region for a non-input signal, e.g., s $\in$ ER(+p), then in s, +p must fire. And if we remain an indefinite time in any state of quiescent region, e.g., s' $\in$ QR(+p), then in s', +p will never fire.

Lemma: N-shot firing

The firing requirement is satisfied if and only if every state of any excitation region of a non-input signal is covered by an n-shot cube. Sufficiency proof: An n-shot cube that is not a trigger cube produces a pulse while the excitation region is traversed. If we remain enough time in a state such that the n-shot cube covering it turns ON and enough time passes to +fire the flip-flop then we satisfy the firing requirement. For an n-shot cube that is a trigger cube, the proof follows directly from the SG trigger requirement. An n-shot cube that covers a state s of ER(+p) covers no states of QR(-p) or ER(-p) and because all SET gates are forced to stabilize then +p can never fire in these regions. In QR(+p), as the n-shot stabilization phase overrides the environment, no cubes can be excited. It makes no difference whether a state of QR(+p) is covered or not because all cubes are forced to stabilize at ZERO.

Necessity proof: If no cubes cover a state of an excitation region then no firing can occur. If a cube that covers s ∈ ER(+p) is not an n-shot cube and thus it covers some state s' of QR(-p), then in s' +p may fire because after -p has fired, if we remain an indeterminate time in s', the second stabilization step in the n-shot architecture takes place and after it is finished the circuit is put in the set-mode, i.e., it becomes ready to fire +p. As a cube to fire +p covers s' then +p fires in s'.

Theorem: Hazard-freeness

A semi-modular SG admits a hazard-free implementation in the n-shot architecture if and only if it satisfies: 1. the n-shot requirement and 2. the delay requirement. Proof: In the last section we examined the delay requirement. The necessity and sufficiency of the n-shot requirement follows from the lemmas on the SG trigger requirement and the n-shot firing.

SG coverage

We prove that any single traversal semi-modular SG that satisfies CSC always admits a hazard-free solution with an optimal SOP core solution in the n-shot architecture. At the SG level we only need to satisfy the n-shot requirement. We show that for the single traversal SGs that satisfy CSC, we always satisfy the n-shot requirement.

Definition: Single traversal SGs

A single traversal SG is a semi-modular SG for which any trigger region contains only one state. Single traversal SGs can be distributive or non-distributive.

Lemma: Trigger cubes for single traversal SGs

Given any single traversal SG, then any trigger region is always coverable by a trigger cube. Proof: A single state can always be covered by a cube.

Lemma: N-shot & CSC

Given any single traversal SG that satisfies CSC, then any state of any excitation region for non-input signals can be covered by an n-shot cube. Proof: If each state s of each excitation region is covered by a cube and this cube only covers s, (max cube) then this cube is an n-shot cube. Suppose that a cube c covers s E ER(+p). Then c may cover some other state in another ER(+p). It may not cover any states of QR(+p) or ER(-p) because any state in these regions differ from s by at least one bit (p=0 in ER(+p) and p=1 in QR(+p) and ER(-p)). As CSC is satisfied, no states of QR(-p) can be covered, because two states with the same code may not have different excited non-input signals. Thus, all states of any excitation region always admit an n-shot cube.

Theorem: Existence of a solution

Any single traversal semi-modular SG that satisfies CSC, always satisfies the n-shot requirement, i.e., a hazard-free solution always exist. Proof: With the lemma on trigger cubes for single traversal SGs and the lemma on n-shot & CSC, we proved that any max cube is an n-shot cube and any trigger region can be covered by a max cube. Thus, we can always satisfy the n-shot requirement and hence a hazard-free solution follows.

For a single traversal SG that satisfies CSC, the problem we have is then an optimization problem because a solution is guaranteed to exist. At this point we have an important result, as a solution is guaranteed to exist for single traversal SGs and the SOP core can contain hazards, there is no difference whether this core is part of a synchronous circuit or not in order to minimize it. Then we can use any minimization technique to find an optimal solution, because we pose no constraints to find the minimal solution. Exact minimizers like expresso-exact can be used to determine the optimal solution.

APPENDIX C

NECESSARY AND SUFFICIENT CONDITIONS FOR EXAMPLE ARCHITECTURE REQUIREMENTS

Given an optimal cube cover, the problem is how to determine which further condition or requirements the optimal cover satisfies.

The optimal cube already satisfies a condition that is present in all requirements: any cube of an optimal solution covers no states of the OFF-set (no coverage feature). It means that, e.g., the SET-SOP cubes for some signal p cover no states of ER(-p) or QR(-p). Thus it already satisfies one of the conditions for an HC, MC, one-shot, n-shot, auto__C cube. Then the next step is to check whether the rest of the conditions for a given cube type is satisfied.

The general procedure is:
1. Preliminary Steps
   a. generate partial cubes
   b. check for containment
3. check for satisfaction of particular architecture requirements I. Preliminary Steps A. Generation of partial cubes An important aspect for a one-shot, auto__C, and n-shot cube is that we do not need to check the coverage of QR(+p) because in the underlying architectures, the environment is overridden during the traversal of any QR(+p). Thus, the problem is reduced to checking the coverage of the excitation regions (ER). For the excitation regions we derive a set of cubes that only satisfy the conditions relative to the excitation regions. These cubes are called partial cubes.

Definition: Partial cube

Given a signal, p, and a region R, representing a set of connected states where p is excited, a partial cube, k, is constructed with all literals that have a constant value in R and (1.) if a signal y=0 in R then we place ¬y in k and (2.) if a signal y=1 in R then we place y in k.

If R represents an excitation region, then k is called a pseudo-one-shot cube. If R represents a partial excitation region (PER), then k is called a pseudo-auto__C cube. If R represents a trigger region (TR), then k is called a pseudo-trigger cube. Thus we can generate all partial cubes for a given specific region type.

Lemma: Partial cube invasion

Given e.g., R=ER(+p) or PER(+p) or TR(+p) then a partial cube k may cover a state of QR(-p).

B. Containment verification procedure

The containment verification procedure checks whether each partial cube is contained in at least one cube in the optimal cube set.

Definition: Cube Containment

A partial cube, pc=y__1 ... y__j, is contained in an optimal cube, oc=1__1 ... 1__i≤j, denoted as pc⊆oc, if every literal of oc is present in pc.

27

Theorem: Containment

When an optimal cube op(+a) contains a partial cube p(+a) then p(+a) does not cover a state of ER(-a) and QR(-a).

Theorem: N-shot satisfiability

PartialS=set of partial cubes. OptimalS=set of optimal cubes. If PartialS is composed of trigger cubes; OptimalS is composed of optimal cube covers for a function domain; and PartialS is contained in some of the cubes of OptimalS, then the optimal SOP solution satisfies the n-shot requirement.

II. Check Architecture Requirements for Satisfaction

Once containment is satisfied, one-shot and auto_C requirements are examined.

A. One-shot overlap check

For the one-shot and auto_C requirements, we still need to verify partial cube overlapping in order to check satisfiability of these requirements.

Definition: Cube overlapping

A cube $u=1\_1 \ldots 1\_j$ overlaps with a cube $v=y\_1 \ldots y\_p$, denoted as $u \cap v$, if after eliminating all the common literals, we have: 1. $\forall$ remaining literals $1\_i \in u$, $\neg \exists y\_k \in v | (y\_k = \neg 1\_i)$; and 2. $\forall$ remaining literals $y\_i \in v$, $\neg \exists 1\_k \in u | (1\_k = \neg y\_i)$. For example, suppose we have two cubes u=-b-d and v=ab-d, then u and v overlap. If u=ab-d and v=(¬a)b-d, then u and v do not overlap.

Theorem: One-shot satisfiability

One-shotS=a set of pseudo one-shot cubes; os_i is a cube of One-shotS. If PartialS=One-shotS; OptimalS is composed of optimal cube covers for a function domain; and the containment and overlap checks are satisfied, then the optimal SOP solution satisfies the one-shot requirement.

Theorem: N-shot to MC, HC

If the one-shot containment or the overlap check fails then neither the MC nor the HC requirements can be satisfied. If the one-shot containment check fails, it means that there exists an excitation region that cannot be entirely covered by a single cube. This is a necessary condition to satisfy the MC or the HC requirements. If the one-shot overlap check fails, it means that there is an excitation region where there are at least two cubes that can get excited. This violates the MC and the HC requirements. However, when both the one-shot containment and overlap check are satisfied, nothing can be stated about the satisfiability of the MC or HC requirements.

B. Auto_C overlap Check

The auto_C requirement allows overlapping if the overlapping states are trigger regions. The procedure to check satisfiability of the auto_C requirement by an optimal cube set is a composition of the containment and overlapping checks.

Definition: Overlapping cube

When two cubes, $u=1_1 \ldots 1_j$ and $v=y_1 \ldots y_p$ overlap, the overlapping states define a cube that we call an overlapping cube, denoted as $ov=u \cap v$, which is constructed with all literals of u and v. For example, suppose we have two overlapping cubes u=-b-d and v=ab-d, then ov=ab--d.

Theorem: Auto_C satisfiability

TriggerS=set of all trigger cubes; AutoS=set of psuedo auto_C cubes. If in the containment check, PartialS=AutoS and the containment check is satisfied; and the auto_C check is satisfied (trigger overlapping condition satisfied), then the optimal SOP solution satisfies the auto_C requirement.

Proof: When the containment check is satisfied, we have that any cube of an optimal SET-SOP core for some signal p already satisfies the condition that: (1.) no ER(-p), QR(-p) is covered; and (2.) every ER(+p) is covered by a one-shot cube. When the auto_C check is satisfied, we satisfy the condition that any overlapping state is part of a trigger region.

28

C. HC check

To check an optimal solution against the HC requirement, we have to change the function domains to derive the minimal cover. For HC, the DON'T CARE set only contains unreachable states (i.e., it does not include 1 for SET, and 0 for RESET). Thus, for the set function, $fp_{set}$ that defines the SET-SOP core for some signal p, we have:

if p=0* or 1, $s_i$ is placed into the ps-ON-set;
if p=1* or 0, $s_i$ is placed into the ps-OFF-set;

Similarly, for the reset function, $fp_{reset}$ that defines the RESET-SOP core for some signal p, we have:

if p=1* or 0, $s_i$ is placed into the pr-ON-set;
if p=0* or 1, $s_i$ is placed into the pr-OFF-set;

All states that are unreachable from any state in the SG, are placed into the pr- and ps-DON'T-care sets.

Thus the difference for the HC requirement (pure logic) is that the DON'T-care-set is only composed of unreachable states, while for the other requirements (flip-flop-based) the DON'T-care-set is composed of the states of the quiescent region.

The checking procedure is the same as the one-shot check procedure. If one-shot requirement is satisfied then the HC requirement is satisfied else it is not. The reason why the procedure to check the HC and the one-shot requirements are essentially the same is that both requirements only differ by a scaling factor for the function domain sets and the cube cover sets. For the one-shot requirement we have everything defined over excitation regions and for the HC requirement, over excitation and quiescent regions.

D. MC Check

When the one-shot check is satisfied, we know that the MC and the HMC requirements can be satisfied. The gain from a one-shot to an MC implementation is a fixed gain of two AND gates and the decrease of one input for every SOP cube.

To verify the MC requirement, we have to check each optimal cube, e.g., c(+p) against all states of any QR(+p), to verify if c(+p) is a monotonous cube. Monotonicity reduces the one-shot space.

Monotonicity check

In order to verify monotonicity, we know that: (1.) the one-shot requirement is satisfied and (2.) that the graph is distributive. Thus, the OptimalS set contains all one-shot cubes that might be MC cubes.

The verification is done in two steps. First, generate a new cover of an intermediate function, that we call non-monotonous function. Then, if a one-shot cube overlaps with the non-monotonous cover set then the one-shot cover is not monotonic.

What is claimed is:

1. A method for generating a hazard-free asynchronous circuit representation of an asynchronous process, the method comprising the steps of:

generating a race-free representation of an asynchronous process;

deriving a logic solution from the representation, wherein the logic solution can be hazardous; and incorporating the logic solution in a flip-flop-based hazard-free asynchronous circuit representation, wherein said circuit representation produces a hazard-free output signal given a sum-of-products (SOP) logic solution to the asynchronous process, said circuit comprising:

a first RS latch having an input coupled to an output signal of an asynchronous flip-flop;

first and a second AND gate, each AND gate coupled to the first RS latch and the SOP solution;

a second RS latch coupled to the first and the second AND gates;

a filter coupled to the second RS latch for filtering hazardous signals;

a third RS latch coupled to the filter, for generating a hazard-free asynchronous output signal; and a delay line coupled to the output signal and the input of the first RS latch.

2. The method of claim 1 wherein the race-free representation is state graph that satisfies a complete state coding (CSC) requirement.

3. The method of claim 1 wherein the logic solution is a sum-of-products (SOP) logic solution.

4. The method of claim 3 wherein the incorporating step comprises:

adding a literal to each sum term in the SOP logic solution;

adding a product term to the SOP logic solution; and adding at least one delay line to the asynchronous flip-flop circuit representation.

5. The method of claim 3 wherein the incorporating step comprises:

adding one delay line to the asynchronous flip-flop circuit representation.

6. The method of claim 1 wherein the deriving step further comprises the step of:

optimizing the logic solution using synchronous optimization techniques.

7. The method of claim 1 wherein the incorporating step comprises the steps of:

determining an asynchronous circuit architecture as a function of the race-free representation of the asynchronous process; and incorporating the logic solution in the determined architecture asynchronous circuit architecture.

8. A method for generating a hazard-free asynchronous circuit representation of an asynchronous process, the method comprising the steps of:

generating a race-free state graph representation of an asynchronous process;

deriving a sum-of-products logic solution from the state graph, wherein the logic solution can be hazardous;

optimizing the logic solution using synchronous optimization techniques;

determining an optimal asynchronous circuit architecture as a function of the race-free representation of the asynchronous process; and incorporating the optimized logic solution in the optimal asynchronous circuit architecture, said architecture comprising:

a first RS latch having an input coupled to an output signal of an asynchronous flip-flop;

a first and a second AND gate, each AND gate coupled to the first RS latch and the SOP solution;

a second RS latch coupled to the first and the second AND gates;

a filter coupled to the second RS latch for filtering hazardous signals;

a third RS latch coupled to the filter, for generating a hazard-free asynchronous output signal; and a delay line coupled to the output signal and the input of the first RS latch.

9. A method for generating a hazard-free asynchronous circuit representation of an asynchronous process, the method comprising the steps of:

generating a race-free state graph representation of an asynchronous process, wherein the state graph can be non-distributive;

deriving a logic solution from the representation; and incorporating the logic solution in a flip-flop-based hazard-free asynchronous circuit representation, wherein the circuit representation comprises:

a first RS latch having an input coupled to an output signal of an asynchronous flip-flop;

a first and a second AND gate, each AND gate coupled to the first RS latch and the SOP solution;

a second RS latch coupled to the first and the second AND gates;

a filter coupled to the second RS latch for filtering hazardous signals;

a third RS latch coupled to the filter, for generating a hazard-free asynchronous output signal; and a delay line coupled to the output signal and the input of the first RS latch.

10. A method for determining a hazard-free asynchronous circuit architecture, the method comprising the steps of:

generating a race-free state graph representation of an asynchronous process; and determining an asynchronous circuit architecture for implementing the state graph based on characteristics of the state graph, wherein the architecture comprises:

a first RS latch having an input coupled to an output signal of an asynchronous flip-flop;

a first and a second AND gate, each AND gate coupled to the first RS latch and a sum-of-products (SOP) logic solution;

a second RS latch coupled to the first and the second AND gates;

a filter coupled to the second RS latch for filtering hazardous signals;

a third RS latch coupled to the filter, for generating a hazard-free asynchronous output signal; and a delay line coupled to the output signal and the input of the first RS latch.

11. The method of claim 10 wherein the state graph comprises excitation regions and the determining step comprises the steps of:

generating a set of optimal cubes that cover the state graph;

generating a set of partial cubes that cover the excitation regions of the state graph;

determining if each partial cube is contained by at least one optimal cube; and selecting an asynchronous circuit architecture for implementing the state graph based on the prior step.

12. The method of claim 10 wherein the state graph comprises excitation regions and the determining step comprises the steps of:

generating a set of partial cubes that cover the excitation regions of the state graph;

determining if any two partial cubes overlap each other in the stage graph representation; and selecting an asynchronous circuit architecture for implementing the state graph based on the prior step.

13. The method of claim 12 wherein the state graph comprises trigger regions and the determining step comprises the steps of:

determining if partial cubes overlap in the trigger regions of the state graph representation.

* * * * *